(12) United States Patent
Kim et al.

(10) Patent No.: US 9,564,876 B2
(45) Date of Patent: Feb. 7, 2017

(54) DIGITAL COMPENSATION FOR A NON-LINEAR ANALOG RECEIVER

(71) Applicant: NANOSEMI, INC., Waltham, MA (US)

(72) Inventors: Helen H. Kim, Sudbury, MA (US); Alexandre Megretski, Concord, MA (US); Yan Li, Lexington, MA (US); Kevin Chuang, Cambridge, MA (US)

(73) Assignee: NANOSEMI, INC., Watham, MA (US)

( * ) Notice: Subject to any disclaimer, the term of this patent is extended or adjusted under 35 U.S.C. 154(b) by 198 days.

(21) Appl. No.: 14/492,180

(22) Filed: Sep. 22, 2014

(65) Prior Publication Data
US 2016/0087604 A1    Mar. 24, 2016

(51) Int. Cl.
  *G06F 17/10*  (2006.01)
  *H03H 17/02*  (2006.01)

(52) U.S. Cl.
  CPC .................... *H03H 17/0261* (2013.01)

(58) Field of Classification Search
  None
  See application file for complete search history.

(56) References Cited

U.S. PATENT DOCUMENTS

| | | | | |
|---|---|---|---|---|
| 6,407,685 B1 * | 6/2002 | Handel | ............... | H03M 1/1038 341/118 |
| 7,443,326 B2 * | 10/2008 | Raphaeli | ................. | H03M 1/72 341/144 |
| 8,242,818 B2 | 8/2012 | Kim et al. | | |
| 2010/0103455 A1 * | 4/2010 | Morikawa | .......... | G02B 17/0647 358/1.15 |
| 2011/0314074 A1 | 12/2011 | Batruni | | |
| 2012/0176191 A1 | 7/2012 | Kim et al. | | |
| 2013/0044791 A1 * | 2/2013 | Rimini | .................. | H04B 1/109 375/219 |
| 2014/0029658 A1 * | 1/2014 | Kim | ...................... | H04B 1/109 375/229 |
| 2014/0030995 A1 * | 1/2014 | Kim | ........................ | H04B 1/10 455/295 |
| 2016/0087604 A1 * | 3/2016 | Kim | ................... | H03H 17/0261 708/304 |

OTHER PUBLICATIONS

Bosch et al. "Measurement and Simulation of Memory Effects in Predistortion Linearizers," IEEE Transactions on Microwave Theory and Techniques, vol. 37, No. 12, Dec. 1989.

Cavers, James K. "Amplifier Linearization Using a Digital Predistorter with Fast Adaptation and Low Memory Requirements," IEEE Transactions on Vehicular Technology, vol. 39, No. 4, Nov. 1990.

(Continued)

*Primary Examiner* — David H Malzahn
(74) *Attorney, Agent, or Firm* — Lando & Anastasi, LLP

(57) ABSTRACT

Aspects and embodiments are directed to non-linear systems including a digital compensator structure, a method of digital compensation, and methods for designing digital compensator structures for analog receivers. A digital compensator is configured to substantially reduce the one or more nonlinear distortion components in the sampled digital output signal from the analog receiver to provide an output signal achieving a receiver linearity requirement for the combination of the analog receiver and a digital compensator.

35 Claims, 17 Drawing Sheets

(56) References Cited

OTHER PUBLICATIONS

D'Andrea et al. "Nonlinear Predistortion of OFDM Signals over Frequency-Selective Fading Channels," IEEE Transactions on Communications, vol. 49, No. 5, May 2001.

Hong et al. "Weighted Polynomial Digital Predistortion for Low Memory Effect Doherty Power Amplifier," IEEE Transactions on Microwave Theory and Techniques, vol. 55, No. 5, May 2007.

Lajoinie et al. "Efficient Simulation of NPR for the Optimum Design of Satellite Transponders SSPAs," IEEE MTT-S Digest, 1998.

Morgan et al. "A Generalized Memory Polynomial Model for Digital Predistortion of RF Power Amplifiers," IEEE Transactions on Signal Processing, vol. 54, No. 10, Oct. 2006.

Panigada et al. "A 130 mW 100 MS/s Pipelined ADC With 69 dB SNDR Enabled by Digital Harmonic Distortion Correction," IEEE Journal of Solid-State Circuits, vol. 44, No. 12, Dec. 2009.

Sevic et al. "A Novel Envelope-Termination Load-Pull Method for ACPR Optimization of RF/Microwave Power Amplifiers," IEEE MTT-S Digest, 1998.

Tai, Wei "Efficient Watt-Level Power Amplifiers in Deeply Scaled CMOS," Department of Electrical and Computer Engineering, National Taiwan University, May 2011.

Yan Li et al. "High-Throughput Signal Component Separator for Asymmetric Multi-Level Outphasing Power Amplifiers," IEEE Journal of Solid-State Circuits, vol. 48, No. 2, Feb. 2013.

Yu et al. "Band-Limited Volterra Series-Based Digital Predistortion for Wideband RF Power Amplifiers," IEEE Transactions on Microwave Theory and Techniques, vol. 60, No. 12, Dec. 2012.

Zhang et al. Design of Linear RF Outphasing Power Amplifiers. Boston: Artech House, 2003. Print (pp. 35-85).

Zhu et al. "Digital Predistortion for Envelope-Tracking Power Amplifiers Using Decomposed Piecewise Volterra Series," IEEE Transactions on Microwave Theory and Techniques, vol. 56, No. 10, Oct. 2008.

\* cited by examiner

DIGITAL COMPENSATION FOR A NON-LINEAR ANALOG RECEIVER

FIELD

The subject matter disclosed herein relates generally to digital compensators, and, more particularly, to digital compensators for non-linear analog receivers.

BACKGROUND

Naturally occurring signals such as image, radio waves, light, and sound signals are analog. These signals can be amplified/filtered in the analog domain and converted to digital signals for further processing. Devices used to sense and detect analog signals and/or process and analyze analog signals have limited accuracy and linearity. Such devices can detect and amplify not only the desired signals but also generate other spurious signals. For instance, an amplifier(s) or amplifiers with an active filter may be operated in regions where harmonic distortions become significant and limit the accuracy of a detection level of a desired signal. An analog to digital converter (ADC), which converts analog signals to the digital domain, may contain a highly nonlinear circuit such as a sample and hold and a comparator that introduces non-linear errors, and/or be preceded with a nonlinear analog front-end (e.g. pre-amplifier, input network, etc). For example, an error in any or all of sampling and gain and offset in the ADC during sampling of a finite analog level can result in a large number of harmonic distortions. FIG. 1 is a graph of an example of an ADC output signal, which is plotted in frequency domain. A single frequency tone is filtered and applied as an input to the ADC. As illustrated, the Fast Fourier Transform (FFT) output spectrum of the signal from the ADC has many orders of harmonic distortions. Even $100^{th}$ order harmonics can be visible depending on the noise floor of the signal spectrum. FIG. 2 illustrates an example of the FFT output spectrum of the signal from the ADC with two input frequency tones applied at the input to the ADC. The figure illustrates that the ADC output signal has many intermodulation distortions. Thus, if a signal is broadband, occupying more than a single frequency tone, and the broadband signal enters a nonlinear circuit such as any of the devices mentioned above, the desired output signal will contain spurious harmonic and intermodulation distortion content. For systems requiring high fidelity in sound, clear image, uncorrupted RF and optical signals, it is important to recover or maintain the spectral purity of the input signal in the frequency domain and/or minimize distortion in time domain. Nonlinear systems can be used to detect small signals in the presence of signals with significantly larger amplitudes. Such detection typically requires a high spur-free dynamic range (SFDR), which is a measure of the amplitude of the fundamental with respect to the amplitude of the largest harmonic tone or spur.

SUMMARY OF INVENTION

Aspects and embodiments are directed to non-linear systems including a digital compensator structure, a method of digital compensation, and methods for designing digital compensator structures for analog receivers. In particular, a digital compensator to be coupled to an output of an analog receiver comprises at least one fixed, discrete-time (DT), linear time invariant (LTI) filter configured based on the known non-linear aspects of the analog receiver, followed by at least one reduced-complexity, discrete-time, nonlinear compensator that provides a compensated output signal. The digital compensator is configured to substantially reduce the one or more nonlinear distortion components in the sampled digital output signal from the analog receiver to provide an output signal achieving a receiver linearity requirement for the combination of the analog receiver and a digital compensator.

A non-linear digital compensation system comprises an analog receiver followed by a digital compensator. The analog receiver includes a plurality of analog circuit components (analog front-end) and an analog-to-digital converter. At least some of the analog circuit components have known nonlinear response characteristics. The analog receiver receives a continuous time input signal x(t) and provides a sampled digital output signal y[n], which has one or more nonlinear distortion components. A digital compensator is coupled to an output of the analog receiver. The digital compensator includes at least one fixed, discrete-time (DT), linear time invariant (LTI) filter configured based on the known non-linear aspects of the analog receiver that provides an output signal z[n], followed by at least one reduced-complexity, discrete-time, nonlinear compensator that provides a compensated output signal u[n]. The digital compensator is configured in combination with the analog receiver to substantially reduce the one or more nonlinear distortion components in the sampled digital output signal of the analog receiver y[n], to provide an output signal u[n] achieving a receiver linearity requirement.

According to at least one embodiment, the fixed, discrete-time (DT), linear time invariant (LTI) filter is a single-input multiple-output (SIMO) filter configured based on the known non-linear aspects of the analog receiver that provides multiple output signals z[n], followed by at least one reduced-complexity, discrete-time, multiple-input, single-output (MISO) nonlinear compensator that receives the multiple output signals z[n] and provides a single compensated output signal u[n].

According to at least one embodiment, the one or more nonlinear distortion components comprise sampled harmonic and intermodulation terms, and the digital compensator is configured to provide a sum of products of the filtered and time-delayed analog receiver samples combined and mapped through memoryless nonlinearities to represent the sampled harmonic and intermodulation terms output by the analog receiver.

According to at least one embodiment, the analog receiver is modeled as an ideal sampler that provides an undistorted discrete-time representation of the continuous time input signal x(t) and an added distortion ($\Delta$) component.

According to at least one embodiment, the digital compensator comprises a cascade of one or more stages of compensator elements (1-$\Delta$, or 1-$\Delta_1$ and 1-$\Delta_2$, . . . ), that replicate the discrete time distortion ($\Delta$) component and subtracts the replicated discrete time distortion ($\Delta$) component so as to substantially reduce the added distortion ($\Delta$) component provided by the analog receiver to yield an distortion component of the output signal approximately proportional to $\Delta^2$.

According to at least one embodiment, the digital compensator includes a plurality of fixed, discrete-time (DT), linear time invariant (LTI) filters in series with a respective plurality of reduced-complexity, discrete-time, nonlinear compensators, with each such cascaded LTI filters and nonlinear compensator disposed in parallel and configured to account for varying harmonics.

According to at least one embodiment, the fixed, discrete-time (DT), linear time invariant (LTI) single-input multiple-output (SIMO) filter comprises any of IIR filters, Delay lines, FIR filters, and addition matrix.

According to at least one embodiment, the fixed, discrete-time (DT), linear time invariant (LTI) single-input multiple-output (SIMO) filter comprises IIR filters that directly target certain harmonic resonances.

According to at least one embodiment, the fixed, discrete-time (DT), linear time invariant (LTI) single-input multiple-output (SIMO) filter is an all-pass filter.

According to at least one embodiment, the LTI SIMO filter is configured for different Nyquist ranges.

According to at least one embodiment, the digital compensator is further configured to achieve a power requirement for the digital compensator.

According to at least one embodiment, the reduced-complexity nonlinear compensator comprises a memoryless (NL) compensator that compensates the signal $\underline{z}[n]$ from the at least one fixed, discrete-time (DT), linear time invariant (LTI) filter based on coefficients of compensation to provide the compensated output signal u[n].

According to aspects of this embodiment, each parallel branch of the memoryless MISO (NL) compensator can be a simplified Volterra polynomial.

According to aspects of this embodiment, each parallel branch of the memoryless MISO (NL) compensator can be a nonlinear map.

According to aspects of this embodiment, each parallel branch of the memoryless MISO (NL) compensator can be a size-optimized interpolating or piece-wise linear lookup table.

According to aspects of this embodiment, the memoryless (NL) compensator can comprise fixed coefficients that are different for different Nyquist ranges.

According to aspects of this embodiment, the memoryless (NL) compensator comprises coefficients of nonlinear maps that change with changes in external parameters μ and the LTI filter that changes with Nyquist range, and the digital compensator further comprises a calibration unit that computes and provides the coefficients of the nonlinear maps to the memoryless (NL) compensator as a function of the value of the external parameters μ.

According to aspects of this embodiment, the calibration unit computes and provides the coefficients of the nonlinear maps to the memoryless (NL) compensator based at least one of known operating characteristics of the analog receiver, a sensed operating voltage, a sensed temperature, and a Nyquist sampling rate, Nyquist range ($1^{st}$ or $2^{nd}$), input termination impedance type, input from aging sensors, and process variation.

According to at least one embodiment, the analog receiver comprises M-way interleaved Analog-to-Digital Converters (ADCs), and the digital compensator is configured to compensate for the M-way interleaved ADCs.

According to aspects of this embodiment, the digital compensator comprises a shared, fixed LTI system that receives M output signals y[n] provided at the output of the interleaved analog receiver, that partially compensates the M output signals y[n] for known nonlinear response characteristics to a continuous time input signal x(t) to provide M output signals $\underline{z}[n]$ to a bank of M programmable memoryless nonlinearities, which further compensate the M output signals $\underline{z}[n]$ based on coefficients of compensation to provide M output signals, and a summer that sums the M output signals to provide a compensated output signal u[n].

According to aspects of this embodiment, the bank of M programmable memoryless nonlinearities further comprises a respective first multiplier that multiplies one of M output signals with a sin function and a second multiplier that multiplies the one of M output signals with a cos function to provide a shift of each of M output signals.

According to aspects of this embodiment, the fixed LTI system comprises a combination of delay lines and reconstruction filters, followed by a partially-populated addition matrix that produces L combinations of $\underline{z}[n]$ outputs from the fixed LTI system.

According to aspects of this embodiment, each of the M programmable memoryless nonlinearities comprises N memoryless nonlinear (NL) compensators with different compensation coefficients.

According to aspects of this embodiment, each of the M programmable memoryless nonlinearities further comprises a respective first multiplier that multiplies one of M output signals with a sin function and a second multiplier that multiplies the one of M output signals with a cos function to provide a shift of each of M output signals.

A method for designing a non-linear compensator system comprises characterizing nonlinearities in an analog receiver design and designing a digital compensator for the analog receiver design based on the nonlinearities. The analog receiver is configured to receive the continuous time input signal x(t) and provide a sampled digital output signal y[n]. The digital compensator for the analog receiver is designed based on the nonlinearities. The digital compensator is configured based on the response of the analog receiver to substantially reduce the nonlinearities in a sampled digital output signal y[n] of the analog receiver to provide an output signal u[n]. The digital compensator comprises at least one fixed, discrete-time (DT), linear time invariant (LTI) filter configured based on the non-linearities of the analog receiver that provides an output signal $\underline{z}[n]$ followed by at least one reduced-complexity, discrete-time, nonlinear compensator that provides a compensated output signal u[n].

According to at least one embodiment, the designing the digital compensator comprises configuring the at least one fixed, discrete-time (DT), linear time invariant (LTI) filter as a single-input multiple-output (SIMO) filter based on the known non-linear aspects of the analog receiver that provides multiple output signals $\underline{z}[n]$, followed by at least one reduced-complexity, discrete-time, multiple-input, single-output (MISO) nonlinear compensator that receives the multiple output signals $\underline{z}[n]$ and provides a single compensated output signal u[n].

According to at least one embodiment, the method further comprises compensating for one or more sampled harmonic and intermodulation terms with a sum of filtered and time-delayed analog receiver samples combined and mapped through memoryless nonlinearities to represent sampled harmonic and intermodulation terms output by the analog receiver.

According to at least one embodiment, the method further comprises modeling the analog receiver as an ideal sampler that provides an undistorted discrete-time representation of the continuous time input signal x(t) and an added distortion (Δ) component.

According to at least one embodiment, the method further comprises implementing the digital compensator as a cascade of one or more stages of compensator elements (1-Δ, 1-$\Delta_1$ and 1-$\Delta_2$, etc) that replicate the discrete time distortion (Δ) component and that are configured to subtract the replicated discrete time distortion (Δ) component so as to substantially reduce the added distortion (Δ) component provided by the analog receiver to yield an distortion component of the output signal approximately proportional to $\Delta^2$.

According to at least one embodiment, the method further comprises implementing the digital compensator a plurality of fixed, discrete-time (DT), linear time invariant (LTI) single-input multiple-output (SIMO) filters in series with a respective plurality of reduced-complexity, discrete-time, nonlinear compensators, with each such cascaded LTI filters and nonlinear compensator disposed in parallel and configured to account for varying harmonics.

According to at least one embodiment, the method further comprises implementing the fixed, discrete-time (DT), linear time invariant (LTI) single-input multiple-output (SIMO) filter with any of IIR filters, Delay lines, FIR filters, and an addition matrix.

According to at least one embodiment, the method further comprises implementing the fixed, discrete-time (DT), linear time invariant (LTI) single-input multiple-output (SIMO) filter with IIR filters that directly target certain harmonic resonances.

According to at least one embodiment, the method further comprises implementing the fixed, discrete-time (DT), linear time invariant (LTI) single-input multiple-output (SIMO) filter as an all-pass filter.

According to at least one embodiment, the method further comprises implementing the fixed-LTI single-input multiple-output (SIMO) filter that is different for different Nyquist ranges.

According to at least one embodiment, the method further comprises configuring the digital compensator to achieve a power requirement for the digital compensator.

According to at least one embodiment, the method further comprises implementing the reduced-complexity nonlinear compensator as a memoryless (NL) multiple-input single output (MISO) compensator that compensates the signal $\underline{z}[n]$ from the at least one fixed, discrete-time (DT), linear time invariant (LTI) single-input multiple-output (SIMO) filter based on coefficients of compensation to provide the compensated output signal u[n].

According to aspects of this embodiment, the method comprises implementing each parallel branch the memoryless (NL) MISO compensator as a simplified Volterra polynomial.

According to aspects of this embodiment, the method comprises implementing each parallel branch of the memoryless (NL) MISO compensator as a nonlinear map.

According to aspects of this embodiment, the method comprises implementing each parallel branch of the memoryless (NL) MISO compensator as a size-optimized lookup table.

According to aspects of this embodiment, the method comprises implementing the memoryless (NL) compensator with nonlinear maps that change with changes in external parameters μ, and implementing the LTI filter that changes with Nyquist range, and designing the digital compensator further comprises providing a calibration unit that computes and provides the coefficients of the nonlinear maps to the memoryless (NL) compensator as a function of the value of the external parameters μ. According to aspects of this embodiment, the method comprises determining the coefficients based on at least one of known operating characteristics of the analog receiver, a sensed operating voltage, a sensed temperature, and a Nyquist sampling rate, Nyquist range ($1^{st}$ or $2^{nd}$), input termination impedance type, input from aging sensors, and process variation.

According to at least one embodiment, the method further comprises implementing the analog receiver with M-way interleaved Analog-to-Digital Converters (ADCs), and designing the digital compensator to compensate for the M-way interleaved ADCs.

According to aspects of this embodiment, the method further comprises implementing the digital compensator as a shared, fixed LTI system that receives M output signals y[n] provided at the output of the interleaved analog receiver, that partially compensates the M output signals y[n] for known nonlinear response characteristics to a continuous time input signal x(t) to provide M output signals $\underline{z}[n]$ to a bank of M programmable memoryless nonlinearities, which further compensate the M output signals $\underline{z}[n]$ based on coefficients of compensation to provide M output signals, and that sums the M output signals to provide a compensated output signal u[n].

According to aspects of this embodiment, the method further comprises implementing the a bank of M programmable memoryless nonlinearities with a respective first multiplier that multiplies one of M output signals with a sin function and a second multiplier that multiplies the one of M output signals with a cos function to provide a shift of each of M output signals.

According to aspects of this embodiment, the method further comprises implementing the digital compensator as a combination of delay lines and reconstruction filters, followed by a partially-populated addition matrix that produces L combinations of $\underline{z}[n]$ outputs from the fixed LTI system.

According to aspects of this embodiment, the method further comprises implementing each of the M programmable memoryless nonlinearities with N memoryless nonlinear (NL) compensators with different compensation coefficients. According to aspects of this embodiment, the method further comprises implementing each of the M programmable memoryless nonlinearities with a respective first multiplier that multiplies one of M output signals with a sin function and a second multiplier that multiplies the one of M output signals with a cos function to provide a shift of each of M output signals.

According to at least one embodiment, the method further comprises estimating power consumption of the digital compensator.

According to at least one embodiment, the method further comprises delivering a series of multi-tone signals to an input of the analog receiver design and analyzing resulting output signals. A digital compensator comprises at least one fixed, discrete-time (DT), linear time invariant (LTI) filter that provides an output signal $\underline{z}[n]$ and that is configured based on the known non-linear aspects of an analog receiver, followed by at least one reduced-complexity, discrete-time, nonlinear compensator that provides a compensated output signal u[n]. The digital compensator is configured to substantially reduce the one or more nonlinear distortion components in the sampled digital output signal of the analog receiver y[n], to provide an output signal u[n] achieving a receiver linearity requirement.

According to at least one embodiment, the fixed, discrete-time (DT), linear time invariant (LTI) filter is a single-input multiple-output (SIMO) filter configured based on the known non-linear aspects of the analog receiver that provides multiple output signals $\underline{z}[n]$, followed by at least one reduced-complexity, discrete-time, multiple-input, single-output (MISO) nonlinear compensator that receives the multiple output signals $\underline{z}[n]$ and provides a single compensated output signal u[n].

According to at least one embodiment, the digital compensator is configured to provide a sum of products of the filtered and time-delayed analog receiver samples combined and mapped through memoryless nonlinearities to represent sampled harmonics and intermodulation terms output by the analog receiver.

According to at least one embodiment, the digital compensator comprises a cascade of one of more stages of compensator elements (1-$\Delta$, or 1-$\Delta_1$ and 1-$\Delta_2$), that replicate the discrete time distortion ($\Delta$) component and subtracts the replicated discrete time distortion ($\Delta$) component so as to substantially reduce the added distortion ($\Delta$) component provided by the analog receiver to yield an distortion component of the output signal approximately proportional to $\Delta^2$.

According to at least one embodiment, the digital compensator includes a plurality of fixed, discrete-time (DT), linear time invariant (LTI) filters in series with a respective plurality of reduced-complexity, discrete-time, nonlinear compensators, with each such cascaded LTI filters and nonlinear compensator disposed in parallel and configured to account for varying harmonics.

According to at least one embodiment, the fixed, discrete-time (DT), linear time invariant (LTI) single-input multiple-output (SIMO) filter comprises any of IIR filters, Delay lines, FIR filters, and addition matrix.

According to at least one embodiment, the fixed, discrete-time (DT), linear time invariant (LTI) single-input multiple-output (SIMO) filter comprises IIR filters that directly target certain harmonic resonances.

According to at least one embodiment, the fixed, discrete-time (DT), linear time invariant (LTI) single-input multiple-output (SIMO) filter is an all-pass filter.

According to at least one embodiment, the LTI SIMO filter is configured for different Nyquist ranges.

According to at least one embodiment, the digital compensator is further configured to achieve a power requirement for the digital compensator.

According to at least one embodiment, the reduced-complexity nonlinear compensator comprises a memoryless (NL) compensator that compensates the signal $\underline{z}[n]$ from the at least one fixed, discrete-time (DT), linear time invariant (LTI) single-input multiple-output (SIMO) filter based on coefficients of compensation to provide the compensated output signal u[n].

According to aspects of this embodiment, each branch of the memoryless (NL) compensator can be a simplified Volterra polynomial.

According to aspects of this embodiment, each branch of the memoryless (NL) compensator can be a nonlinear map.

According to aspects of this embodiment, each branch of the memoryless (NL) compensator can be a size-optimized interpolating or piece-wise linear lookup table.

According to aspects of this embodiment, the memoryless (NL) compensator can comprise fixed coefficients that are different for different Nyquist ranges.

According to aspects of this embodiment, the memoryless (NL) compensator comprises coefficients of nonlinear maps that change with changes in external parameters $\mu$, and the LTI filter that changes with Nyquist range, and the digital compensator further comprises a calibration unit that computes and provides the coefficients of the nonlinear maps to the memoryless (NL) compensator as a function of the value of the external parameters $\mu$. According to aspects of this embodiment, the calibration unit computes and provides the coefficients of the nonlinear maps to the memoryless (NL) compensator based at least one of known operating characteristics of the analog receiver, a sensed operating voltage, a sensed temperature, and a Nyquist sampling rate, Nyquist range ($1^{st}$ or $2^{nd}$), input termination impedance type, input from aging sensors, and process variation.

According to aspects of this embodiment, the digital compensator comprises a shared, fixed LTI system that receives M output signals y[n] provided at the output of M-way interleaved Analog-to-Digital Converters (ADCs), that partially compensates the M output signals y[n] for known nonlinear response characteristics to a continuous time input signal x(t) to provide M output signals $\underline{z}[n]$ to a bank of M programmable memoryless nonlinearities, which further compensate the M output signals $\underline{z}[n]$ based on coefficients of compensation to provide M output signals, and a summer that sums the M output signals to provide a compensated output signal u[n].

According to aspects of this embodiment, the bank of M programmable memoryless nonlinearities further comprises a respective first multiplier that multiplies one of M output signals with a sin function and a second multiplier that multiplies the one of M output signals with a cos function to provide a shift of each of M output signals. According to aspects of this embodiment, the fixed LTI system comprises a combination of delay lines and reconstruction filters, followed by a partially-populated addition matrix that produces L combinations of z[n] outputs from the fixed LTI system.

According to aspects of this embodiment, each of the M programmable memoryless nonlinearities comprises N memoryless nonlinear (NL) compensators with different compensation coefficients.

According to aspects of this embodiment, each of the M programmable memoryless nonlinearities further comprises a respective first multiplier that multiplies one of M output signals with a sin function and a second multiplier that multiplies the one of M output signals with a cos function to provide a shift of each of M output signals.

A method for designing digital compensator comprising designing a digital compensator for the analog receiver design based on known nonlinearities of the analog receiver, the digital compensator configured to substantially reduce the nonlinearities in a sampled digital output signal y[n] of the analog receiver to provide an output signal u[n], the digital compensator comprising at least one fixed, discrete-time (DT), linear time invariant (LTI) filter configured based on the non-linearities of the analog receiver to a continuous time input signal x(t) that provides an output signal $\underline{z}[n]$ followed by at least one reduced-complexity, discrete-time, nonlinear compensator that provides a compensated output signal u[n].

According to at least one embodiment, the designing the digital compensator comprises configuring the at least one fixed, discrete-time (DT), linear time invariant (LTI) filter as a single-input multiple-output (SIMO) filter based on the known non-linear aspects of the analog receiver that provides multiple output signals $\underline{z}[n]$, followed by at least one reduced-complexity, discrete-time, multiple-input, single-output (MISO) nonlinear compensator that receives the multiple output signals $\underline{z}[n]$ and provides a single compensated output signal u[n]. One embodiment of the method for designing a non-linear system comprises configuring the fixed, discrete-time (DT), linear time invariant (LTI) filter as a single-input multiple-output (SIMO) filter based on the known non-linear aspects of the analog receiver and configuring the reduced-complexity, discrete-time, filter as a multiple-input, single-output (MISO) nonlinear compensator that receives the multiple output signals $\underline{z}[n]$ and provides a single compensated output signal u[n].

One embodiment of the analog receiver comprises M-way interleaved Analog-to-Digital Converters (ADCs), and one embodiment of designing the digital compensator comprises configuring the fixed, discrete-time (DT), linear time invariant (LTI) filter as a shared, fixed LTI system that receives M output signals y[n] provided at the output of the M-way interleaved Analog-to-Digital Converters (ADCs), that partially compensates the M output signals y[n] for known nonlinear response characteristics to provide M output signals z[n], and configuring the reduced-complexity, discrete-time, filter as M banks of programmable memoryless nonlinearities that further compensate the M output signals z[n] based on coefficients of compensation to provide M output signals, and further providing a summer that sums the M output signals to provide a compensated output signal u[n].

One embodiment of the method for designing a digital compensator comprises compensating for one or more sampled harmonic and intermodulation terms with a sum of filtered and time-delayed analog receiver samples combined and mapped through memoryless nonlinearities to represent sampled harmonic and intermodulation terms output by the analog receiver.

One embodiment of the method for designing a digital compensator comprises modeling the analog receiver as an ideal sampler that provides an undistorted discrete-time representation of the continuous time input signal x(t) and an added distortion ($\Delta$) component.

One embodiment of the method for designing a digital compensator comprises implementing the digital compensator as a cascade of one or more stages of compensator elements (1-$\Delta$, or 1-$\Delta_1$ and 1-$\Delta_2$) that replicate the discrete time distortion ($\Delta$) component and that are configured to subtract the replicated discrete time distortion ($\Delta$) component so as to substantially reduce the added distortion ($\Delta$) component provided by the analog receiver to yield a distortion component of the output signal approximately proportional to $\Delta^2$.

One embodiment of the method for designing a digital compensator comprises implementing the digital compensator a plurality of fixed, discrete-time (DT), linear time invariant (LTI) filters in series with a respective plurality of reduced-complexity, discrete-time, nonlinear compensators, with each such cascaded LTI filters and nonlinear compensator disposed in parallel and configured to account for varying harmonics.

One embodiment of the method for designing a digital compensator comprises implementing the fixed, discrete-time (DT), linear time invariant (LTI) single-input multiple-output (SIMO) filter with any of IIR filters, Delay lines, FIR filters, and an addition matrix.

One embodiment of the method for designing a digital compensator comprises implementing the fixed, discrete-time (DT), linear time invariant (LTI) single-input multiple-output (SIMO) filter with IIR filters that directly target certain harmonic resonances.

One embodiment of the method for designing a digital compensator comprises implementing the fixed, discrete-time (DT), linear time invariant (LTI) single-input multiple-output (SIMO) filter as an all-pass filter.

One embodiment of the method for designing a digital compensator comprising implementing the with fixed LTI SIMO filter that is different for different Nyquist ranges. One embodiment of the method for designing a digital compensator comprises configuring the digital compensator to achieve a power requirement for the digital compensator. One embodiment of the method for designing a digital compensator comprising implementing the reduced-complexity nonlinear compensator as a memoryless (NL) compensator that compensates the signal z[n] from the at least one fixed, discrete-time (DT), linear time invariant (LTI) single-input multiple-output (SIMO) filter based on coefficients of compensation to provide the compensated output signal u[n].

Aspects of this embodiment comprises implementing each branch of the memoryless (NL) compensator as a simplified Volterra polynomial.

Aspects of this embodiment comprises implementing each branch of the memoryless (NL) compensator as a nonlinear map.

Aspects of this embodiment comprises implementing each branch of the memoryless (NL) compensator as a size-optimized lookup table.

Aspects of this embodiment comprising implementing each branch of the memoryless (NL) compensator with nonlinear maps that change with changes in external parameters $\mu$, and the LTI filter that changes with Nyquist range, and designing the digital compensator further comprises providing a calibration unit that computes and provides the coefficients of the nonlinear maps to the memoryless (NL) compensator as a function of the value of the external parameters $\mu$. Aspects of this embodiment further comprising determining the coefficients based on at least one of known operating characteristics of the analog receiver, a sensed operating voltage, a sensed temperature, and a Nyquist sampling rate, Nyquist range ($1^{st}$ or $2^{nd}$), input termination impedance type, input from aging sensors, and process variation.

One embodiment of the method for designing a digital compensator comprising implementing the analog receiver with M-way interleaved Analog-to-Digital Converters (ADCs), and designing the digital compensator to compensate for the M-way interleaved ADCs.

Aspects of this embodiment comprising implementing the digital compensator as a shared, fixed LTI system that receives M output signals y[n] provided at the output of the interleaved analog receiver, that partially compensates the M output signals y[n] for known nonlinear response characteristics to a continuous time input signal x(t) to provide M output signals z[n] to a bank of M programmable memoryless nonlinearities, which further compensate the M output signals z[n] based on coefficients of compensation to provide M output signals, and that sums the M output signals to provide a compensated output signal u[n].

Aspects of this embodiment comprising implementing the a bank of M programmable memoryless with a respective first multiplier that multiplies one of M output signals with a sin function and a second multiplier that multiplies the one of M output signals with a cos function to provide a shift of each of M output signals.

Aspects of this embodiment comprising implementing the digital compensator as a combination of delay lines and reconstruction filters, followed by a partially-populated addition matrix that produces L combinations of z[n] outputs from the fixed LTI system.

Aspects of this embodiment comprise implementing each of the M programmable memoryless nonlinearities with N memoryless nonlinear (NL) compensators with different compensation coefficients.

Aspects of this embodiment comprise implementing each of the M programmable memoryless nonlinearities with a respective first multiplier that multiplies one of M output signals with a sin function and a second multiplier that multiplies the one of M output signals with a cos function to provide a shift of each of M output signals.

One embodiment of the method for designing a digital compensator comprising estimating power consumption of the digital compensator.

One embodiment of the method for designing a digital compensator comprising delivering a series of multi-tone signals to an input of the analog receiver design and analyzing resulting output signals.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure.

In the figures.

DETAILED DESCRIPTION

Figure 1:
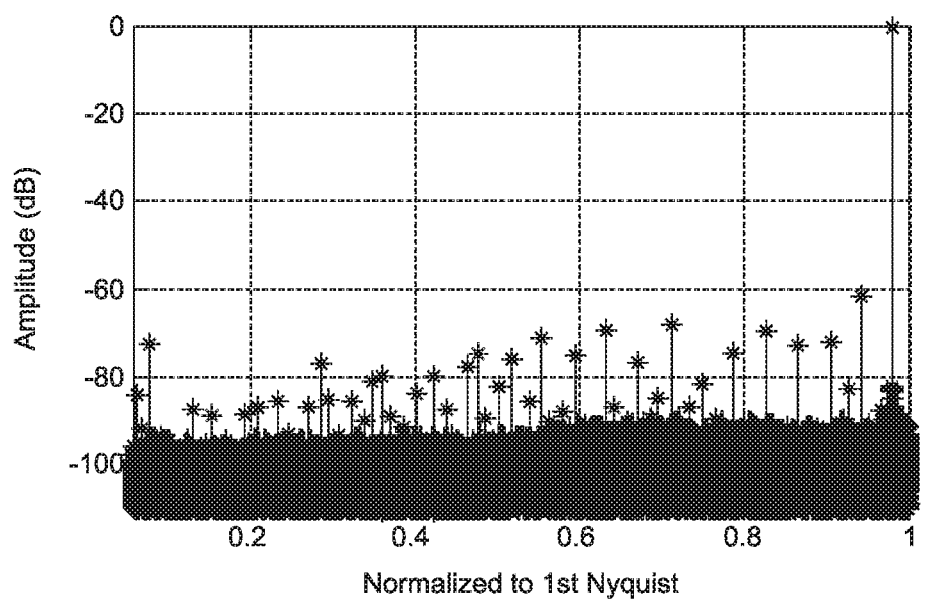
FIG. 1 is a graph of an exemplary output signal from an ADC, which is plotted in frequency domain, for a single tone input signal to the ADC.
Figure 2:
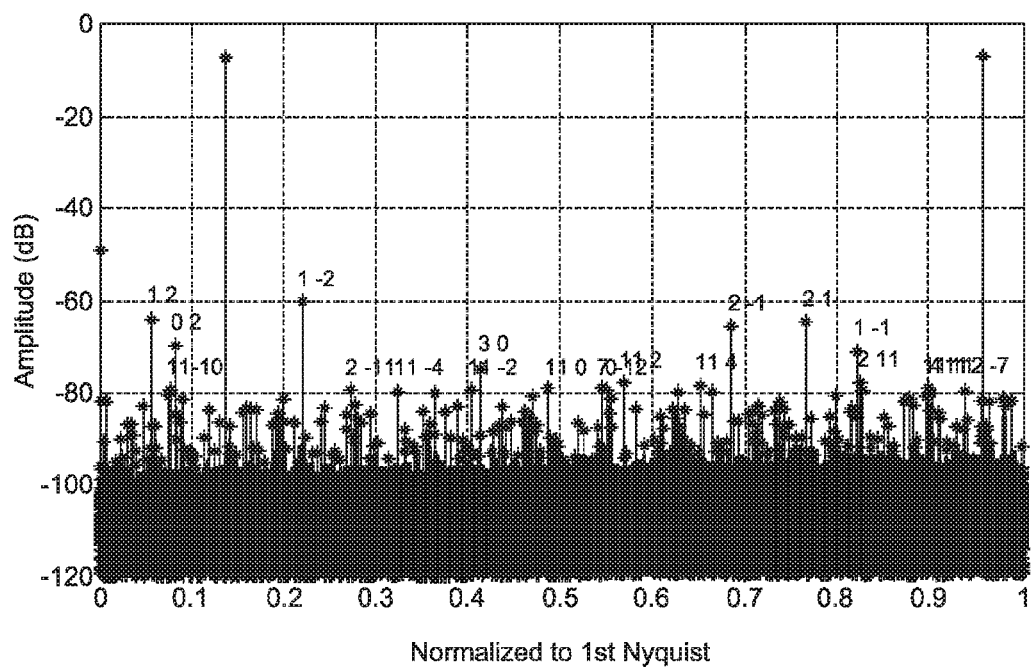
FIG. 2 is a graph of an exemplary output signal from an ADC, which is plotted in frequency domain, for a two tone input signal to the ADC

Aspects and embodiments are directed to non-linear systems including a digital compensator structure, a method of digital compensation, and methods for designing digital compensator structures for analog receivers. In particular, a digital compensator to be coupled to an output of an analog receiver comprises at least one fixed, discrete-time (DT), linear time invariant (LTI) filter configured based on the known non-linear aspects of the analog receiver, followed by at least one reduced-complexity, discrete-time, nonlinear compensator that provides a compensated output signal. Specifically, the discrete-time (DT), linear time invariant (LTI) filter can be a single-input multiple-output (SIMO) filter that provides multiple output signals $\underline{z}[n]$, and the reduced-complexity, discrete-time, compensator can be a multiple-input, single-output (MISO) nonlinear compensator that receives the multiple output signals $\underline{z}[n]$ and provides a single compensated output signal $u[n]$. The digital compensator is configured to substantially reduce the one or more nonlinear distortion components in the sampled digital output signal from the analog receiver to provide an output signal achieving a receiver linearity requirement for the combination of the analog receiver and a digital compensator.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

As will be appreciated by one skilled in the art, aspects of the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more non-transitory computer readable medium(s) having computer readable storage program code embodied thereon.

Any combination of one or more computer readable medium(s) may be utilized. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium or media that can store a program for use by or in connection with an instruction execution system, apparatus, or device.

Program code embodied on a computer readable storage medium may be transmitted using any appropriate medium, including but not limited to wireless, wire-line, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Embodiments of a digital compensation method and apparatus described herein provide for integrated components with reduced complexity and improved performance, for example, improved linearity and in some embodiments minimized overall complexity/area and/or power consumption. One embodiment of a non-linear system comprises an analog receiver followed by a digital compensator. In another embodiment, the non-linear system includes any nonlinear components followed by a digital compensator. In another embodiment, the non-linear system includes a plurality of groups of circuits, wherein each group includes at least one nonlinear circuit followed by a digital compensator. Such non-linear systems typically include analog continuous-time nonlinear distortion and a final analog to digital conversion, although they are not limited to such. In one example, a non-linear system is converted to the digital domain, a digital compensation is performed and the resulting compensated digital output is converted back to the analog domain.

In a conventional analog system, nonlinearities are attempted to be equalized while maintaining a high SFDR, low total system power and without occupying a large area. A digital compensator consumes power and area by itself, but can be used in conjunction with a nonlinear analog system to reduce the total power and area of the analog system. The analog system and the digital compensator can be integrated into a monolithic semiconductor, but the concepts described herein also apply to systems with separate components or to hybrid systems using multi-chip modules.

A nonlinear characteristic is a deviation from a linear relationship between an input and an output of a system or circuit. A weak nonlinear response is manifest as an output with harmonics and intermodulation terms as well as the fundamental tone of interest. If the nonlinearity becomes stronger, the gain of the fundamental tone will be reduced and more energy will transfer to the harmonics and intermodulation terms. Although using a digital compensator can reduce many nonlinear effects, memory effects in the circuit make compensation more difficult. Memory effects change the nonlinear behavior of the circuit based on the state circuit. For example, hysteresis, delays and filtering effects can cause the nonlinear behavior of the circuit to change over time. Other issues that cause memory effects are device (e.g. transistor) heating and trapping effects.

Figure 3:
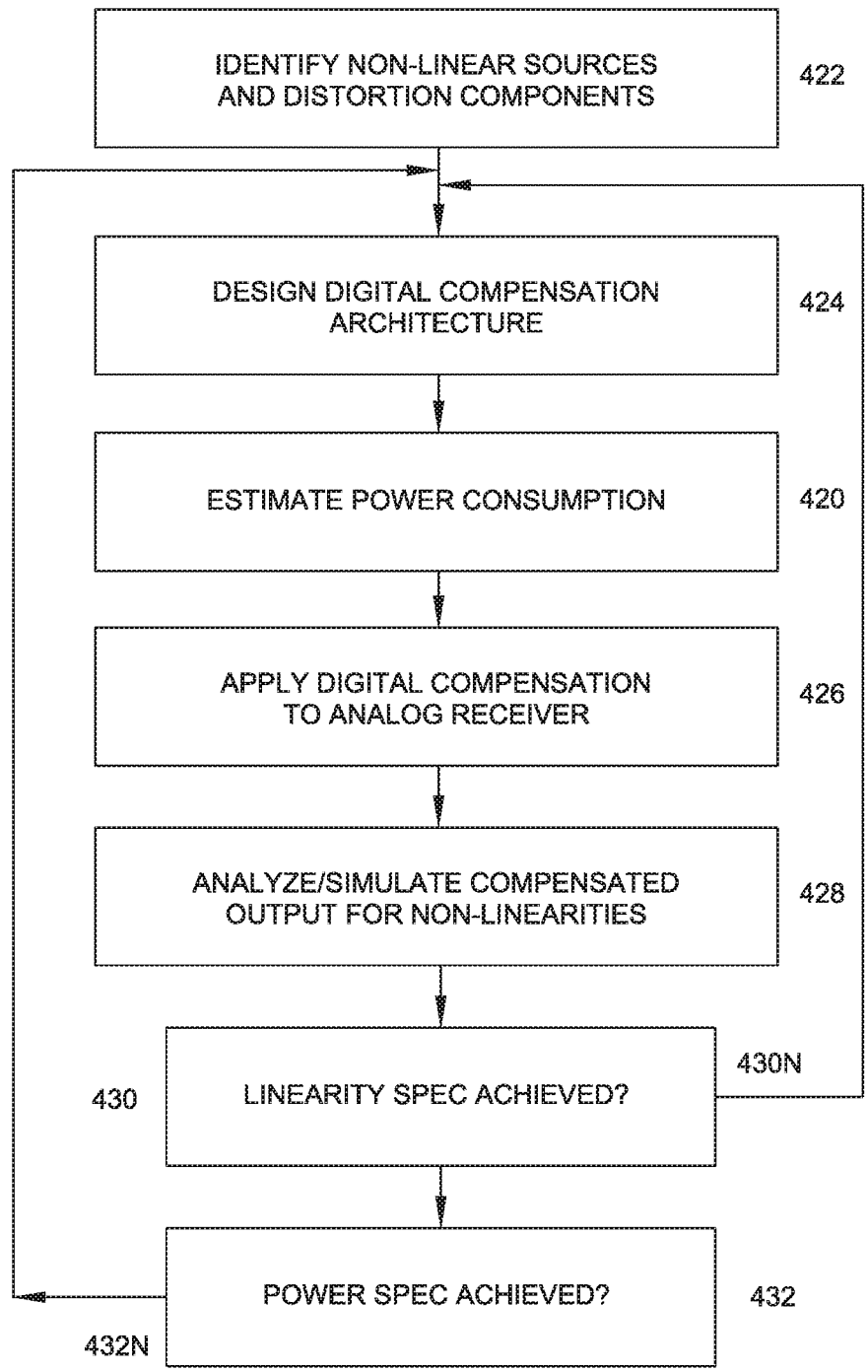
FIG. 3 is a flowchart illustrating a process for designing a digital compensator system in accordance with an embodiment of this disclosure.

FIG. 3 is a flowchart illustrating one process for designing a non-linear system comprising digital compensator system in accordance with an embodiment of this disclosure. The nonlinear components and sources in an analog receiver are identified (block 422), and based on the identification of the non-linearities a digital compensation architecture is designed for reducing or eliminating the nonlinear distortion components in the output of the analog receiver circuit (block 424). In at least one embodiment, the non-linear system includes one or more analog to digital converters (ADCs) coupled to an output of an analog receiver front-end, followed by digital compensator (e.g., a digital equalizer, etc.) that is configured to digitally suppress one or more of the nonlinear distortion components within the output signal from the ADCs of the analog receiver. According to aspects of some embodiments, an optional act of estimating a power consumption of the resulting digital compensator (block 420) may be estimated at this point. The digital compensation architecture may next be applied to the analog receiver system (block 426). The linearity performance of the compensated analog receiver (the non-linear system) may then be simulated (block 428).

If the modified system does not achieve the specified system linearity requirement (block 430—N), then the method 400 may repeat the digital design process to make modifications to the digital compensation architecture. That is, adjustments may be made to the digital compensation architecture (block 424). This process may be repeated until the system linearity requirement has been achieved or some other condition has been met (e.g., a maximum number of design iterations have occurred, etc.). The following acts are an optional aspect of this embodiment or alternatively the process can end. When the digitally modified system achieves the specified system linearity requirement (block 430—Y), then as an option it may next be determined whether a particular power condition of the receiver system has been satisfied (block 432). It is to be appreciated that the power condition may include any condition that is selected to achieve reduced power consumption in the digital compensation circuitry itself or the analog receiver design as a whole. If the power condition is not satisfied (block 432—N), then modifications may be made to the digital compensator circuitry in an effort to achieve further reduction in power consumption in the non-linear system design (block 424), while maintaining the desired linearity level. Thus, according to at least one embodiment of the method of design as disclosed herein, after an initial analog receiver has been designed, nonlinear distortion components within an output signal of the analog receiver are identified (block 422). A digital compensator may then be designed to reduce the nonlinear components (block 424), and the power consumption of the digital compensator is optionally estimated (block 420). In such an implementation, the complexity (power and area consumption) will primarily depend on the complexity of the signal processing that is applied to perform the digital compensation (e.g. in a compensator that represents the nonlinear dynamic system with a polynomial—Volterra series, the complexity will depend on the order of the polynomial used, the number of delays used, and the number of processing elements used (which may each include delay blocks and multipliers)). In one approach, an equation may be generated to estimate the power consumption based on these variables. As will be appreciated by persons of ordinary skill in the art, the specific technique for estimating the power consumption of the digital compensation circuitry will typically depend upon the digital compensation architecture used.

According to aspects of this embodiment, the power condition can be a condition that is selected to achieve an overall receiver design that meets all of the design requirements of the system, while consuming a reduced amount of power. It is to be appreciated that in some implementations, reducing power consumption in the digital compensation circuitry may be the primary concern. However, in other embodiments, the power consumption of the entire receiver may be considered (i.e., both analog and digital portions).

Figure 4:
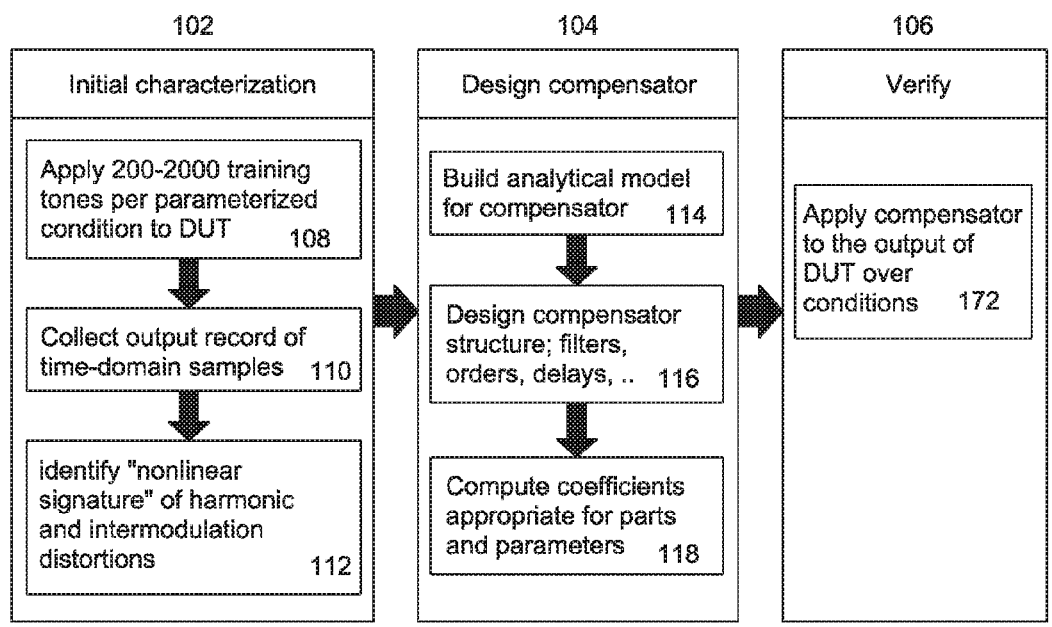
FIG. 4 is a flowchart illustrating further detail of one embodiment of the process for designing a digital compensator system in accordance with this disclosure.

FIG. 4 is a flowchart that illustrates further details of one embodiment of a process 100 for designing a non-linear system comprising a digital compensator system in accordance with this disclosure. The DUT/analog receiver is initially characterized (block 102), and based on the identification of the non-linearities in the analog receiver, a digital compensator for reducing or eliminating the nonlinear distortion components in the output of the analog receiver circuit is designed (block 104). In at least one embodiment, the non-linear system includes one or more analog to digital converters (ADCs) coupled to an output of an analog receiver front-end, followed by digital compensator (e.g., a digital equalizer, etc.) that is configured to digitally suppress one or more of the nonlinear distortion components within the output signal from the ADCs of the analog receiver. The digital compensation architecture may next be verified (block 106).

The initial characterization of the DUT/analog receiver for non-linearities in the analog receiver (block 102) includes applying a plurality of tones for each parameterized condition to be characterized as an input to the DUT/analog receiver (block 108), collecting an output response of the DUT/analog receiver to the plurality of tones for each parameterized condition (block 110), and identifying a non-linear signature of harmonic and intermodulation distortions of the DUT/analog receiver to the plurality of tones for each parameterized condition (block 112).

According to aspects of this embodiment, the applying the plurality of tones (block 108) can comprise applying any number of tones in a range, for example, from 200 to 2000 tones. It is to be appreciated that any number of tones can be used.

According to aspects of this embodiment, the DUT/analog receiver can be characterized for a plurality of parameterized conditions, such as by way of example, the following three parameterized condition ranges: varying the temperature in 10° C. steps, varying the sampling rate in 100-200 MSPS steps; and varying the Supply Voltage Vdd in 5%-10% steps. It is to be appreciated that the DUT/analog receiver can be characterized for any number of parameterized conditions in any number of steps.

According to aspects of this embodiment, the collecting an output response of the DUT/analog receiver to the plurality of tones for each parameterized condition (block 110) can comprise collecting an output record of time-domain samples that are $2^{14}$ to $2^{17}$ in length. Advantages of using samples of such length include ensuring that the noise floor of the output response of the DUT/analog receiver are at least 10 dB below the target spurious free dynamic range (SFDR) of the DUT/analog receiver. It is to be appreciated that output record of time-domain samples can be any length.

The designing of the digital compensator for reducing or eliminating the nonlinear distortion components in the output of the analog receiver (block 104) includes building an analytical model for the digital compensator (block 114), designing the digital compensator structure with building blocks/parts (block 116) such as, for example, filters, orders, delays, etc., and computing coefficients appropriate for the building blocks/parts (block 118). According to aspects of this embodiment, the designing of the digital compensator is based on the data collected from identifying a non-linear signature of harmonic and intermodulation distortions of the DUT/analog receiver to the plurality of tones for each parameterized condition (block 112).

The digital compensation architecture can be verified (block 106) by applying the digital compensation architecture to the output of analog receiver/DUT system over various conditions to verify the design of the digital compensator (block 172). According to aspects of this embodiment, the verifying of the digital compensation architecture by applying the digital compensator to the output of analog receiver system (block 106) can be done over a range of data sets, such as 200-2000 data sets, for the various parameterized conditions. It is to be appreciated that the digital compensator can be verified for any number of data sets for the various parameterized conditions.

In some implementations of the non-linear system design, a digital equalizer may be used as part of the digital compensator to reduce nonlinear distortion components in the output signal of the analog receiver. In non-linear systems having memory effects (e.g., analog receivers, etc.), a general nonlinear finite impulse response (FIR) model that may be used to model nonlinear operation is the Volterra series. This model generalizes the linear FIR filter to polynomial combinations of the input. While this representation captures general nonlinear behavior, its complexity is combinatorial in memory depth (M). The digital compensator captures the harmonic and intermodulation terms. For example, a Volterra kernel can be used. However, the Volterra kernel is a highly comprehensive nonlinear model that is combinatorial and thus not well suited for real-time implementation. According to aspects of various embodiments of a digital compensator of this disclosure, the digital compensator may reduce the corresponding memory effects. Reduction of memory effects is desirable because the complexity and power consumption of the digital compensator grows rapidly with increased memory effects. According to aspects of one embodiment of the design of a digital compensator, the digital compensator can be designed to reduce memory effects with a two stage implementation, as will be disclosed herein.

After using the design techniques described herein, a designer may begin to gain knowledge of how different analog receiver architectures and non-linearities yield certain digital compensator structures, and/or individual receiver component architectures or designs to achieve a desired performance. In such cases, a simpler design process and a simpler digital compensator structure may be generated to achieve system requirements.

Figure 5:
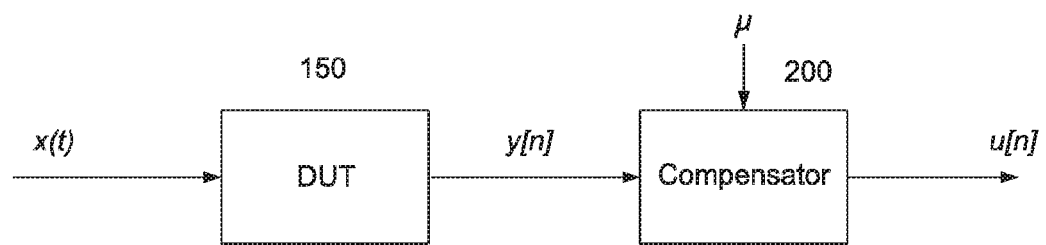
FIG. 5 is a block diagram of one embodiment of a DUT/Analog Receiver in combination with a digital compensator according to the disclosure.

FIG. 5 is a generalized version of one embodiment of a nonlinear system 280 that can be provided according to aspects of this disclosure, comprising an analog receiver 150 that can include an analog front-end and an ADC followed by a digital compensator 200. In FIG. 5, x(t) is a continuous time signal input to a device under test (DUT) 150. The DUT 150 can be any analog device, and according to aspects of this embodiment can include an analog receiver that includes, for example, any of an impedance matching network, an amplifier, a filter, etc., and further includes an analog to digital converter (ADC). The signal y[n] at the output of the DUT/Analog Receiver 150 is a sampled (digital) output signal from the DUT/Analog Receiver. A typical analog receiver outputs a "pure tone", which is a fundamental frequency tone of the input signal x(t), as well as its harmonic tones. If there is no harmonic or intermodulation distortion, then y[n] will be just the fundamental $y_o$. As illustrated in FIG. 5, the signal u[n] is the compensated output signal in discrete time provided by the digital compensator 200 of the signal y[n] provided to the digital compensator. The signal $y_o$ is a pure tone of the output signal from the DUT/Analog Receiver 150 with only a fundamental tone applied at the input x(t), and likewise the signal $u_o$ is pure tone of the output signal from the digital compensator 200 with only a fundamental tone applied at the input x(t).

As will be discussed herein, the goal of the digital compensator 200 is to recover the analog receiver output as close to $y_o$ as possible after cancelling any distortions. Ideally the signal u[n] should have much smaller distortion contents than y[n] (once the digital compensator has been determined). One objective of the digital compensator 200 is to ensure that the harmonic contents of the analog receiver output are significantly smaller after the digital compensator 200. This objective should ideally be met under all operating parameters of interest, μ, such as operating sampling rate, temperature, supply voltage, Nyquist range ($1^{st}$ or $2^{nd}$), type of input network, process variation indicators, etc. Therefore, $u-u_o$ should be much smaller than $y-y_o$.

Figure 6:
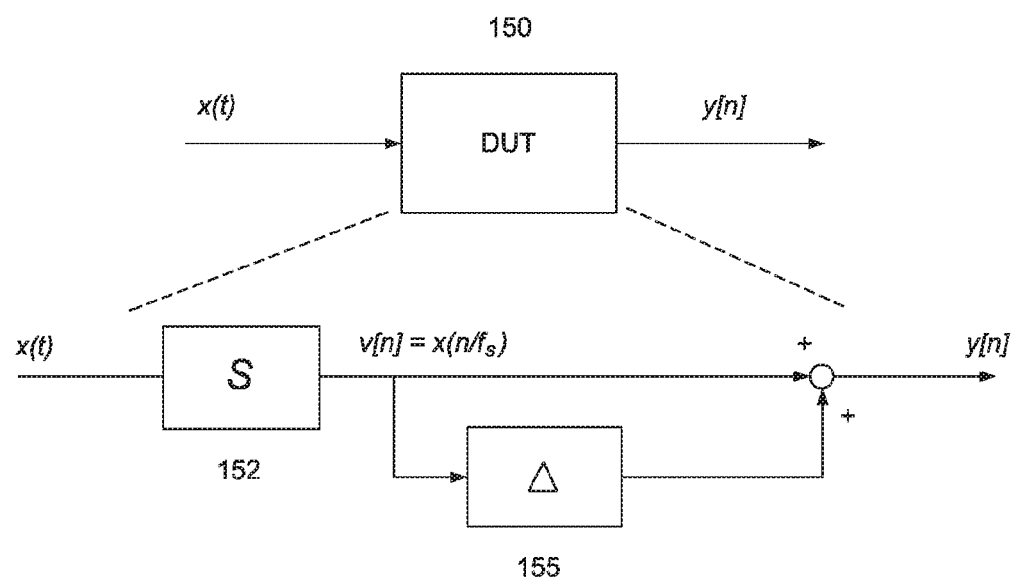
FIG. 6 is a model of the DUT/Analog Receiver component of the non-linear system of FIG. 5.

Referring to FIG. 6, there is illustrated a model of the DUT/Analog Receiver 150 of FIG. 5, which comprises the analog receiver front-end 282 and the ADC 284. For digital compensation purpose, it is desirable to model the DUT/Analog Receiver as an ideal sampler (S) 152 with a small discrete time distortion (Δ) element 154. The output signal from S 152 $v[n]=(n/f_s)$ represents the ideal/undistorted discrete-time representation of the analog signal x(t) provided as an input to the Sampler. The output from the DUT/Analog Receiver 150 is $y[n]=S(x(n))-\Delta(S(x(n)))$.

Figure 7:
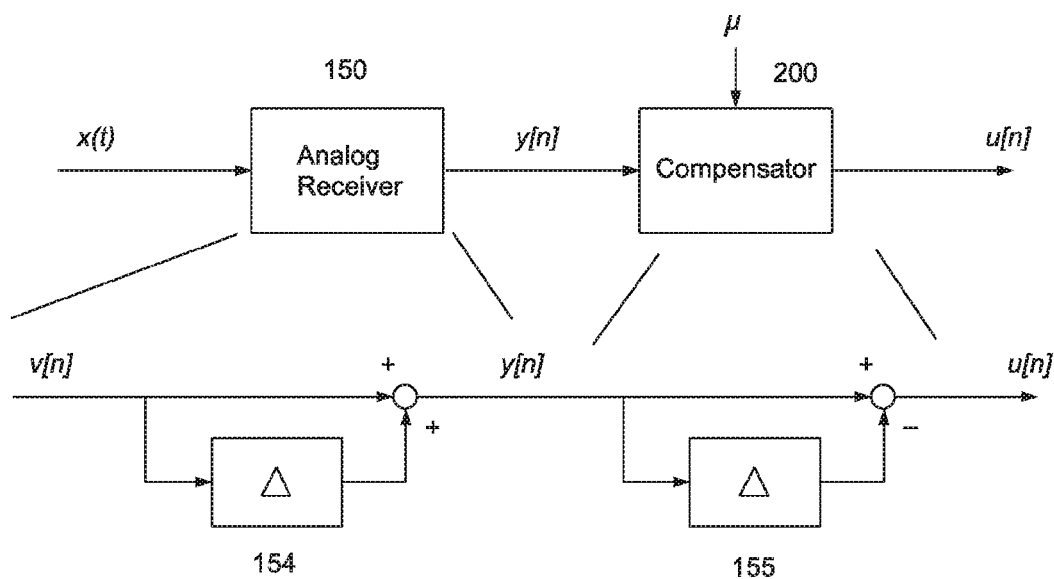
FIG. 7 is a model of an embodiment of a digital compensator structure for compensating the DUT/Analog Receiver component of the non-linear system of FIG. 5.

FIG. 7 is a model of an embodiment of a digital compensator structure 200 for compensating the DUT/Analog Receiver component 150 of the non-linear system of FIG. 5. The digital compensator 200 receives the discrete time inputs $y[n]=S(x(n))-\Delta(S(x(n)))$ output from the DUT/Analog Receiver component 150, replicates the small distortion 154 (Δ) introduced by the analog sampling receiver to produce a replicated distortion component 155 (Δ), and adds the replicated distortion component 155 (Δ) to the signal $y[n]=S(x(n))-\Delta(S(x(n)))$ including the small distortion 154 (Δ) introduced by the analog sampling receiver to subtract the small distortion component 154 (Δ) from the signal y[n] to provide the output signal u[n]=y[n]. With this arrangement, the digital compensator 200 cancels the small distortion 154 (Δ) factor from the output signal u[n] and yields an error component approximately proportional to $\Delta^2$, which is a much smaller value than Δ for a value of Δ<1. If the distortion component Δ is large, the replicated distortion component 155 (Δ) can be represented as a cascade of two compensators (1-$\Delta_1$ and 1-$\Delta_2$), and so on. In particular, for larger delta Δ values (e.g. for $2^{nd}$ Nyquist range of a sampled signal), the digital compensator may comprise two or more cascaded stages. Thus, one advantage of this embodiment of a digital compensator 200 is that it is suitable for compensating an ADC or a general receiver-chain comprising an ADC, due to lack of access to ADC/receiver-chain analog signal input (the input x(t) can't be feed directly into the compensator). Another advantage of this embodiment of a digital compensator is that it works well for a non-linear device having an ADC that introduces a small distortion component 154 ($\Delta$).

However, generating the digital representation of the compensator $\Delta$ without understanding the source of nonlinearities in the analog receiver can lead to very complex and inefficient compensator structures based on topologies that do not represent well the intrinsic dynamic system interaction inside the analog receiver.

Figure 8:
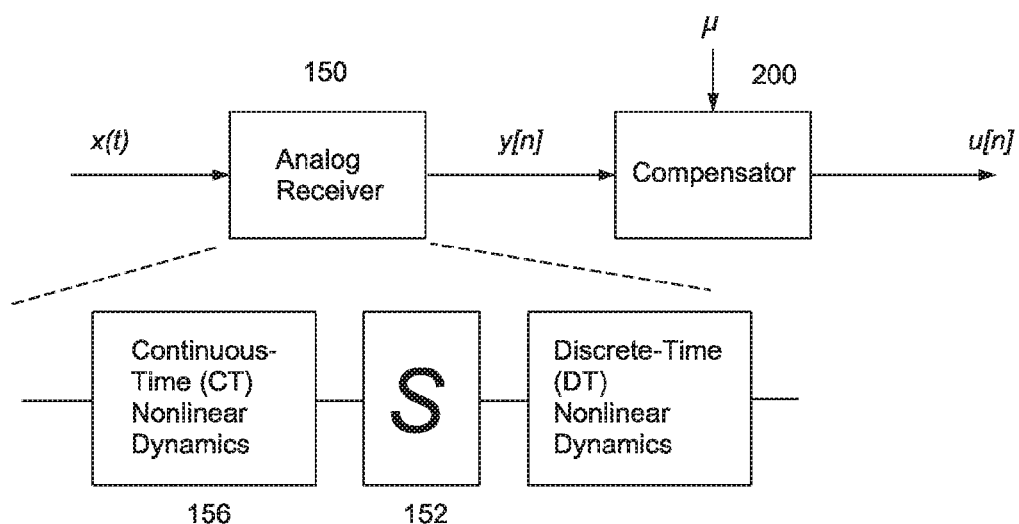
FIG. 8 illustrates another model of the DUT/Analog Receiver of FIG. 5.

Referring to FIG. 8, there is illustrated a more representative model of the dynamics that occur in the DUT/analog receiver 150 of FIG. 5, which comprises the analog receiver front-end and the ADC. The analog receiver can be modeled simply as a cascade of a continuous time nonlinear dynamic system 156, an ideal sampler (S) 152 and a discrete time nonlinear dynamic system 158. The role of the digital compensator 200 in such a system is to compensate for both continuous time nonlinear dynamics that occur in the signal x(t) before the sampler (for example in the input termination network, pre-amplifier or the sample-and-hold circuit of the ADC) and for discrete time nonlinear dynamics that occur after the sampler (for example due to comparator offset, gain, phase mismatch, etc). However, given that the compensator 200 resides exclusively in the discrete-time domain, it should incorporate the effects of both continuous-time nonlinearities of the analog receiver front-end and sample-and-hold circuits, and the discrete-time nonlinearities of the ADC. The discrete compensator $\Delta$, should efficiently represent this continuous-time and discrete-time nonlinear interaction.

Figure 9:
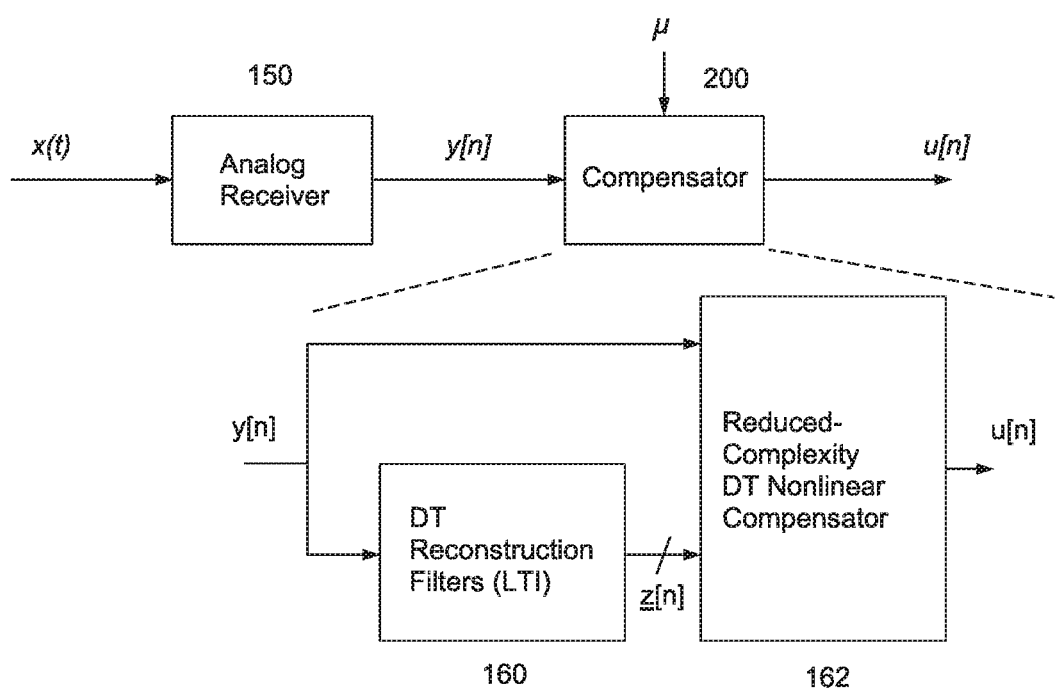
FIG. 9 illustrates is a model of an embodiment of a digital compensator structure for compensating the DUT/Analog Receiver component of the non-linear system of FIG. 8.

FIG. 9 illustrates a model of an embodiment of a digital compensator structure 200 for compensating the DUT/Analog Receiver component 150 of the non-linear system of FIG. 8. As was noted above, a discrete time nonlinear compensator structure typically directly maps onto a polynomial Volterra representation and consists of $2^{nd}$, $3^{rd}$ and n-$^{th}$ order polynomials with delays to account for memory in the system. However, the Volterra kernel based compensators that capture this continuous time-discrete-time nonlinear dynamics end up being overly complex (with long memory), and b/c of that complexity very hard to identify and very sensitive to changes in DUT conditions. According to the aspects of various embodiments of a digital compensator 200 of this disclosure, other forms of discrete time nonlinear compensator structures like Wiener, Hammerstein, Wiener-Hammerstein, etc., can be used, thus potentially reducing the complexity and sensitivity of the general polynomial Volterra representation, provided some prior information about the non-linear system is known. The embodiment of the compensator structure 200 illustrated in FIG. 9 is well suited for such a situation.

In particular, Applicants have identified certain properties of analog receivers that in at least one embodiment make a special version of the Wiener compensator representation particularly suitable for use in the digital compensator structure 200 as illustrated in FIG. 9. According to one embodiment, the digital compensator structure 200 includes a fixed linear time invariant (LTI) single-input multiple-output (SIMO) reconstruction filter 160 followed by a reduced-complexity multiple-input single-output (MISO) nonlinear compensator 162, which can often be implemented as a memoryless nonlinearity that can be, for example, simplified Volterra polynomials or a nonlinear map. In particular, Applicants have realized that it is the sampling process (S) itself as illustrated in FIG. 8 that combines the CT nonlinearities 156 with DT nonlinearities 158 into a DT nonlinear system with long memory, but with a special two-stage structure of an LTI (reconstruction) filter 160 with fixed properties followed by a programmable memoryless nonlinear compensator 162. In a digital compensator, ignoring this special structure and attempting a direct map to a Volterra representation causes a prohibitively large number of terms (long memory and relatively large order) and also very sensitive and often poor fitting results (i.e. Volterra coefficient dependency on the properties of the system—$\mu$). According to aspects of this embodiment of the digital compensator 200, by offloading known long-memory aspects to the special fixed linear time invariant (LTI) filter 160, the complexity of the nonlinear compensator 162 can be drastically reduced. According to various embodiments as will be disclosed herein, the fixed linear time invariant (LTI) filter 160 can comprise, for example, any of and combinations of IIR filters, Delay lines and FIR filters. Each memoryless nonlinear (NL) compensator 162 can be comprised of, for example, a LUT with sinusoids with different coefficients (or different polynomials).

This arrangement also significantly improves the stability of the compensator coefficients with respect to system properties $\mu$, such as operating sampling rate, temperature, supply voltage, Nyquist range ($1^{st}$ or $2^{nd}$), type of input network, process variation indicators, etc. In particular, the reduced-complexity DT nonlinear compensator 162 can be provided with fixed coefficients that are different for different Nyquist ranges. In addition, the reduced-complexity DT Nonlinear Compensator can be provided with programmable coefficients that depend on, for example, the part, the operating voltage, the temperature, the sampling rate, etc. Thus one of the advantages of this embodiment of the digital compensator 200 is, for example, a significant reduction in the complexity of the DT NL compensator compared to direct mapping into a single compensator structure without the reconstruction filter component 160 (e.g. direct mapping on a polynomial Volterra representation).

Figure 10:
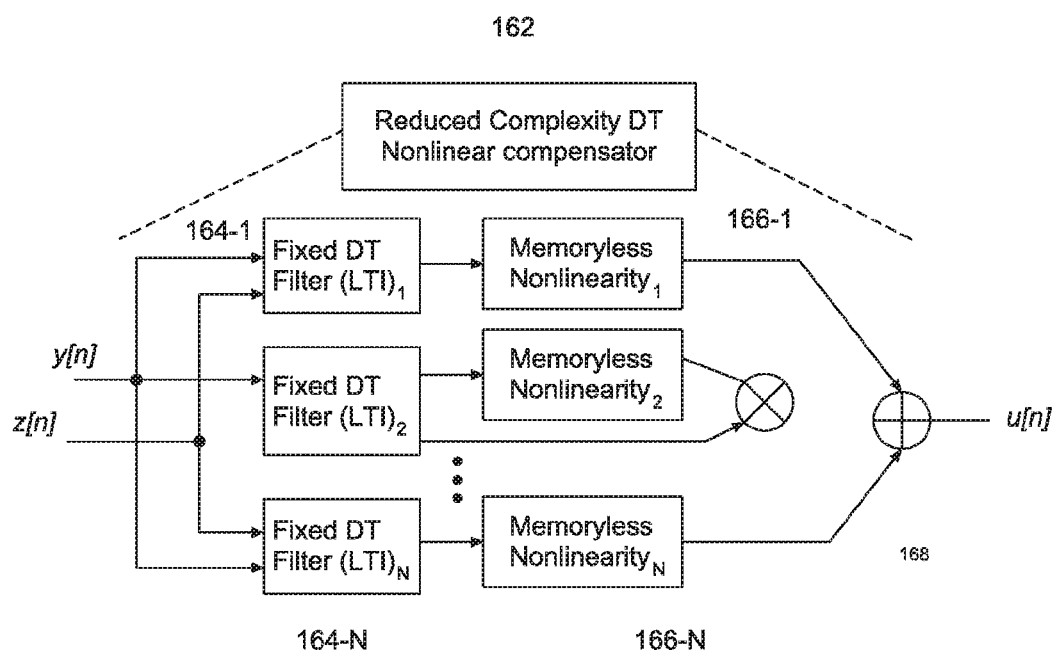
FIG. 10 illustrates one embodiment of a reduced complexity Discrete Time nonlinear compensator.

Referring now to FIG. 10, one embodiment of a reduced complexity DT nonlinear compensator 162 with a specialized Wiener structure is illustrated with a plurality of special LTI filters 164-1 to 164-N in series with a respective plurality of memoryless NL filters 166-1 to 166-N. Each fixed DT LTI filter 164-1 to 164-N can be, for example, an all-pass type filter with a programmable nonlinearity to account for a varying order or harmonics. In some implementations of this embodiment, for example, the all-pass LTI filter 164-1 to 164-N with programmable nonlinearity can represent an efficient compensator realization for dealing with high-order harmonics, and is followed by respective memoryless NL filter 166-1 to 166-N, optimized for such high order harmonics. This embodiment of a reduced complexity DT nonlinear compensator 162 can provide a weighted sum 168 of the products of filtered sampled outputs by the analog receiver 150, and their nonlinear versions (e.g. second, third order powers obtained through the memoryless NL maps). According to aspects of this embodiment, each memoryless NL filter 166-1 to 166-N can be represented as a sum of sinusoids with different coefficients (or different polynomials). It is appreciated that in other embodiments of a reduced complexity DT nonlinear compensator 162, other combinations of specialized LTI filter structures 164 followed by specific memoryless non-linearity filters 166 can be used for efficient compensation of harmonics and intermodulation distortion terms of any order. It is appreciated that the choice of specialized LTI structure and shape of the memoryless nonlinearity will depend heavily on the type of the analog receiver under consideration.

Figure 11:
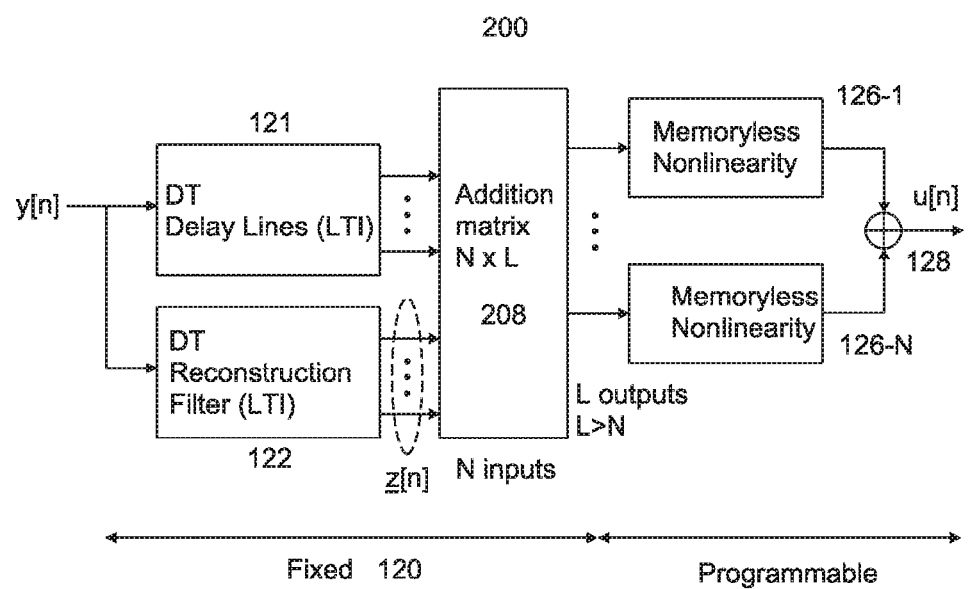
FIG. 11 illustrates one embodiment of digital compensator according to this disclosure.

FIG. 11 illustrates one embodiment of digital compensator 200 according to this disclosure. In this embodiment, a fixed LTI system 120 is realized with a combination of delay lines 121 and reconstruction filters 122, followed by a partially-populated addition matrix 124 that produces combinations of z[n] outputs from the fixed LTI system 120. The N outputs from partially-populated addition matrix 124 are provided to a bank of memoryless nonlinearities 126-1 to 126-N. According to various embodiments of the digital compensator 200 as will be disclosed herein, the fixed linear time invariant (LTI) system 120 can comprise, for example, any combination of IIR filters, Delay lines and FIR filters. In addition, each memoryless nonlinear (NL) compensator 126-1 to 126-N can be, for example, sum of sinusoids with different coefficients (or different polynomials). As with other embodiments, this embodiment of digital compensator 200 can provide a sum 128 of the filtered and time-delayed analog receiver output samples, combined and mapped through a set of memoryless nonlinearities to represent sampled harmonic and intermodulation distortion terms. It is appreciated that this embodiment of a specialized LTI filter system 120 followed by specific memoryless nonlinearity filters 126-1 to 126-N can be used for efficient compensation of harmonics and intermodulation distortion terms of any order. It is also appreciated that the implementation of specialized LTI structure and the shape of the memoryless nonlinearity will depend heavily on the type of the analog receiver under consideration.

Figure 12:
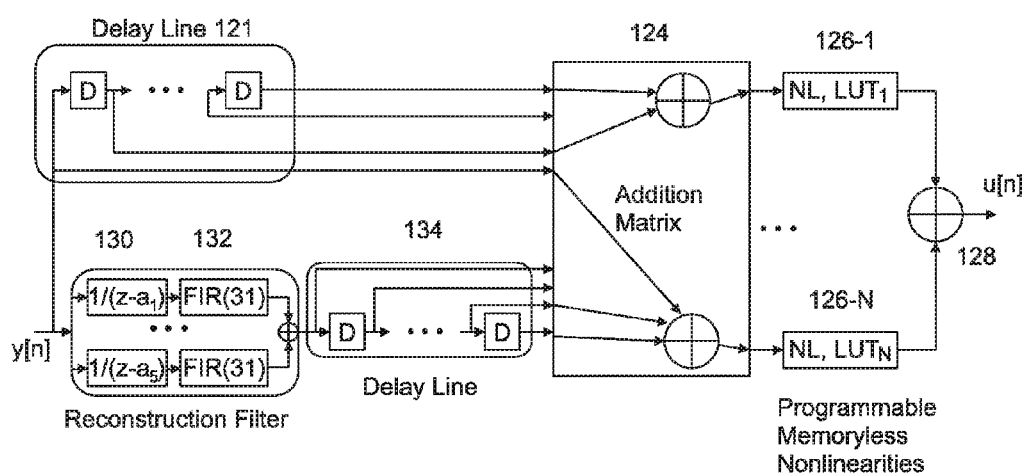
FIG. 12 illustrates one implementation of the embodiment of digital compensator of FIG. 11.

FIG. 12 illustrates one implementation of the embodiment of digital compensator 200 of FIG. 11. In particular, the reconstruction filter 122 is realized as a cascade of a one-tap IIR Filter 130 and a 31-tap FIR filter 132 followed by a delay line 134 with multiple outputs, and the signal y[n] is bypassed by another delay line 121, to create a plurality of delayed and filter signals that are combined appropriately in the addition matrix 124 to provide appropriate signal basis combinations. The appropriate signal basis combinations are provided to a number of programmable memoryless nonlinearities 126-1 to 126-N realized either through direct lookup tables or size-optimized lookup table implementations (e.g. interpolating lookup tables or piece-wise linear lookup-tables).

Figure 13:
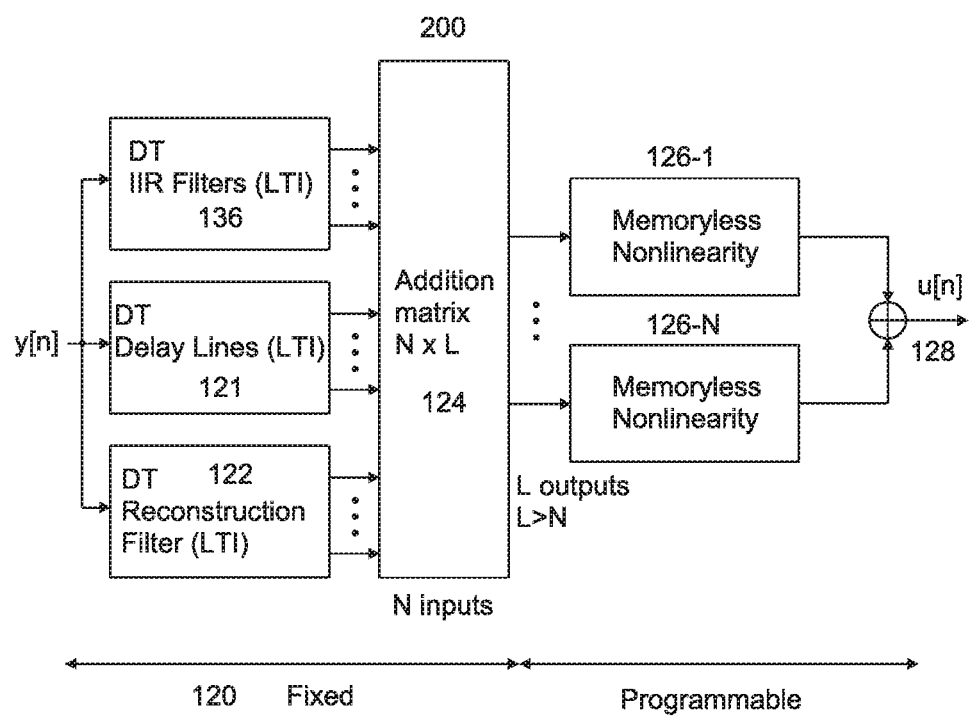
FIG. 13 illustrates one embodiment of digital compensator according to this disclosure.

FIG. 13 illustrates another embodiment of digital compensator 200 according to this disclosure. In this embodiment, a fixed LTI system 120 is realized with a combination of DT Infinite Impulse Response (IIR) Filters 136, delay lines 121, and reconstruction filters 122, followed by a partially-populated addition matrix 124 that produces combinations of z[n] outputs from the a fixed LTI system 120. In this embodiment, a set of filtered signals is expanded by the addition of the IIR filters 136 to directly target certain harmonic resonances. The N outputs from partially-populated addition matrix 124 are provided to a bank of memoryless nonlinearities 126-1 to 126-N. According to aspects of this embodiment, the topology and coefficients of the fixed LTI system 120 are fixed for each type of the analog receiver, while the memoryless nonlinearity 126-1 to 126-N is programmable based on the receiver parameter vector μ. According to aspects of this embodiment, the fixed linear time invariant (LTI) system 120 can comprise, for example, any combination of IIR filters, Delay lines and FIR filters. In addition, each memoryless nonlinear (NL) compensator 126-1 to 126-N can be, for example, a sum of sinusoids with different coefficients (or different polynomials). As with other embodiments, this embodiment of digital compensator 200 can provide a sum 128 of the products of time-delayed and filtered analog receiver samples, combined and mapped through memoryless nonlinearities to represent sampled harmonics and intermodulation distortion terms, and can target certain harmonic resonances output by the analog receiver 150. It is appreciated that this embodiment of a specialized LTI filter system 120 followed by specific memoryless nonlinearity filters 126-1 to 126-N can be used for efficient compensation of harmonics and intermodulation distortion terms and can target certain harmonic resonances of any order. It is also appreciated that the implementation of specialized LTI structure and the shape of the memoryless nonlinearity will depend heavily on the type of the analog receiver under consideration.

One of the ways to increase the sampling rate of an ADC is to have multiple ADCs run in parallel. Such an arrangement of ADCs is called interleaved (or time-interleaved) ADCs. An M-way interleaved ADC has an aggregate sampling rate of M×the sampling rate of a single channel ADC. However, if the M-way interleaved ADCs are not perfectly matched in terms of a precise sampled time, voltage gain, and offset levels amongst the M-ADCs, the resulting ADC output has linear spurs that show up as undesirable tones at fs/2, fs/4, . . . , fs/8, where fs is the sampling rate. In addition to these linear spurs, nonlinear mixing of the linear spurs with harmonic distortion tones results in additional nonlinear spurs. Without proper correction of these linear and non-linear spurs, the SFDR of the ADC is severely degraded. At high sampling rates (e.g., high hundreds of MHz-GHz), it's not practical to match these linear and non-linear spurs in the analog domain where the accuracy of timing matching is in the order of the $10^{-15}$ seconds range for >=12 bit resolution ADC. Some digital correction can account for the linear spurs but not mixing of nonlinear and linear spurs.

Figure 14:
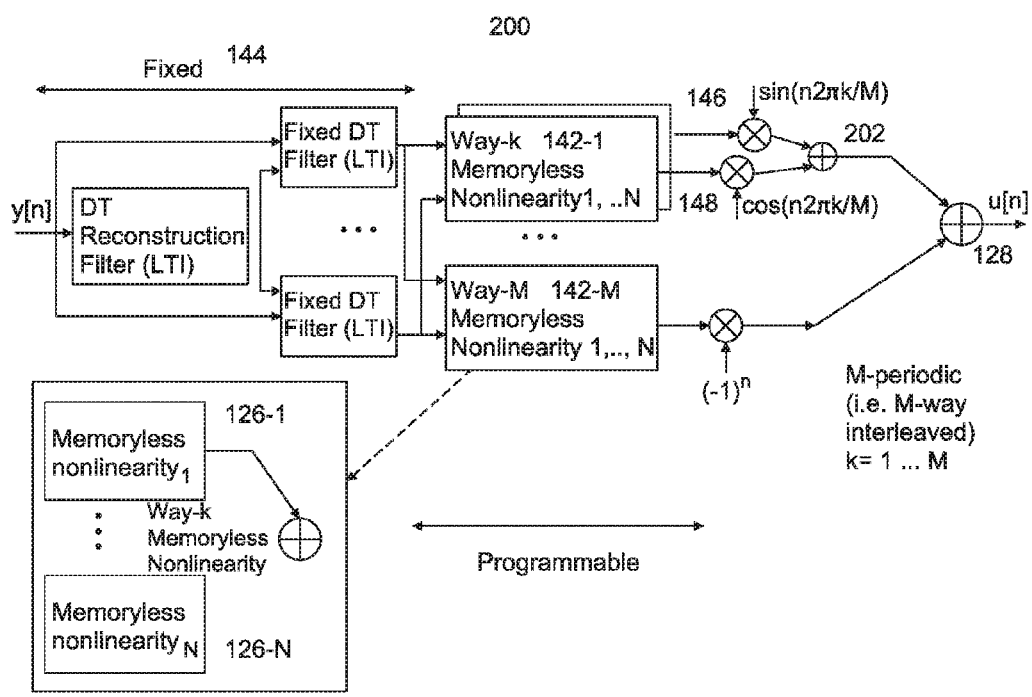
FIG. 14 illustrates another embodiment of digital compensator that can be used with an interleaved analog receiver according to this disclosure.

FIG. 14 illustrates another embodiment of digital compensator 200 that can be used with an interleaved analog receiver according to this disclosure. This embodiment of a digital compensator 200 extends the previous digital compensator embodiments to the case of an interleaved analog receiver 150 comprising M-way interleaved ADCs. According to this embodiment, a shared, fixed LTI system 144 is provided at the output of the interleaved analog receiver 150. The fixed LTI system 144 is a shared system amongst the M output signals y[n] provided at the output of the interleaved analog receiver 150. According to aspects of this embodiment, the shared, fixed LTI system 144 reduces the implementation complexity of the digital compensator 200. The shared, fixed LTI system 144 provides M output signals z[n] to a bank of M programmable memoryless nonlinearities 142-1 to 144-M. According to aspects of this embodiment, the fixed linear time invariant (LTI) system 144 can comprise, for example, any combination of IIR filters, Delay lines and FIR filters. Each memoryless nonlinearity 142-1 to 144-M comprises N memoryless nonlinear (NL) compensators 126-1 to 126-N, which can be, for example, a sum of sinusoids with different coefficients (or different polynomials). Each signal provided at an output of a respective memoryless nonlinearity 142 is multiplied by a multiplier 146 with a sin function and by a multiplier 148 with a cos function and summed by summer 202 at the outputs of the multipliers, to provide a shift of each interleaved signal. Each shifted interleaved signal is summed by summer 128 to provide the output signal u[n]. As with other embodiments that have been disclosed herein, this embodiment of digital compensator 200 can provide a sum from summer 128 of the products of filtered and time-delayed analog receiver samples, combined and mapped through memoryless nonlinearities to represent the sampled harmonic and intermodulation distortion terms output by an M-way interleaved analog receiver 150. It is appreciated that this embodiment of a digital compensator 200 for an interleaved receiver can be used for efficient compensation of harmonics and intermodulation distortion terms of any order. It is also appreciated that the implementation of specialized LTI structure 144 and the shape of the memoryless nonlinearity 146 will depend heavily on the type of the interleaved analog receiver under consideration. It has been shown that this embodiment of a digital compensator 200 structure accounts for both of the linear and non-linear spurs effectively with an improvement at least 10-20 dB in SFDR.

Figure 15:
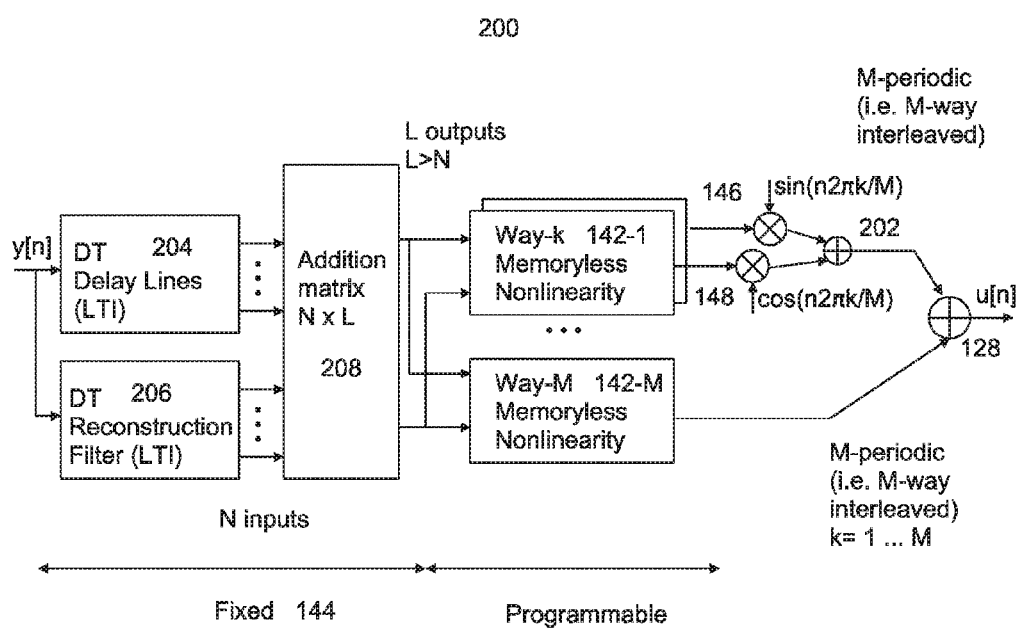
FIG. 15 illustrates one implementation of a digital compensator that can be used with an interleaved analog receiver according to this disclosure.

FIG. 15 illustrates one implementation of an embodiment of digital compensator 200 for to the case of an interleaved analog receiver 150 comprising M-way interleaved ADCs. According to this embodiment, a fixed LTI system 144 is provided at the output of the interleaved analog receiver 150. In this embodiment, the fixed LTI system 144 is realized with a combination of delay lines 204 and reconstruction filters 206, followed by a partially-populated addition matrix 208 that produces L combinations of z[n] outputs from the fixed LTI system 144. The L outputs from partially-populated addition matrix 208 are provided to a bank of memoryless nonlinearities 142-1 to 142-M. Each memoryless nonlinearity 142-1 to 144-M comprises N memoryless nonlinear (NL) compensators 126-1 to 126-N, which can be, for example, a sum of sinusoids with different coefficients (or different polynomials). Each signal provided at an output of a respective memoryless nonlinearity 142 is multiplied by a multiplier 146 with a sin function and by a multiplier 148 with a cos function and summed by summer 202 at the outputs of the multipliers, to provide a shift of each interleaved signal. Each shifted interleaved signal is summed by summer 128 to provide the output signal u[n]. As with other embodiments that have been disclosed herein, this embodiment of digital compensator 200 can provide a sum from summer 128 of the products of filtered and time-delayed analog receiver samples, combined and mapped through memoryless nonlinearities to represent the sampled harmonic and intermodulation distortion terms output by an M-way interleaved analog receiver 150. It is appreciated that this embodiment of a digital compensator 200 for an interleaved receiver can be used for efficient compensation of harmonics and intermodulation distortion terms of any order. It is also appreciated that the implementation of specialized LTI structure 144 and the shape of the memoryless nonlinearity 146 will depend heavily on the type of the interleaved analog receiver under consideration.

Figure 16:
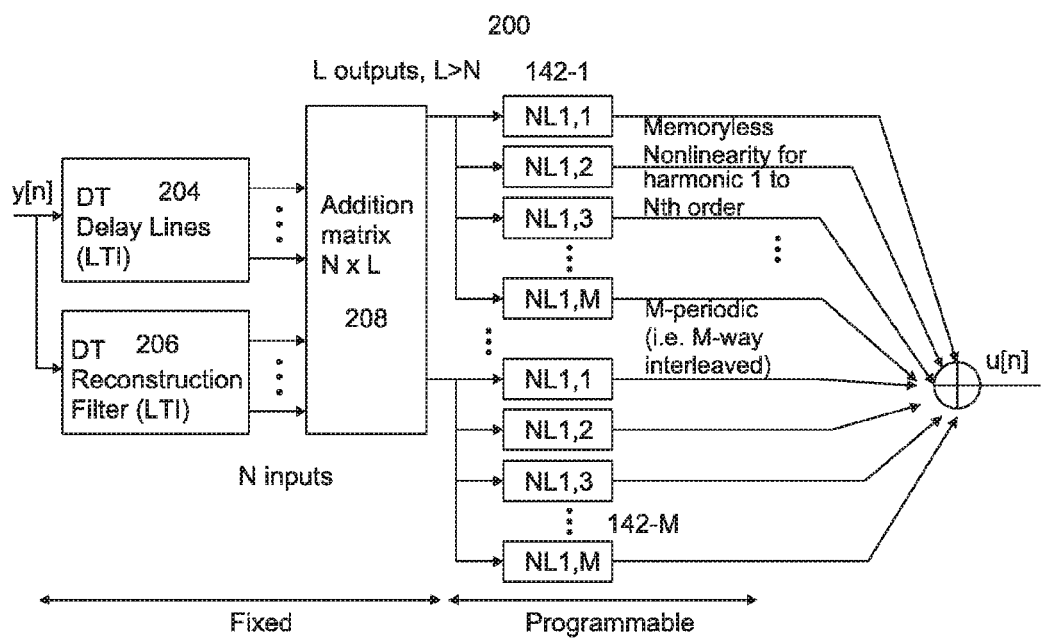
FIG. 16 illustrates another implementation of a digital compensator that can be used with an interleaved analog receiver according to this disclosure.

FIG. 16 illustrates a simplified implementation of an embodiment of digital compensator for an interleaved analog receiver 150 comprising M-way interleaved ADCs. According to this embodiment, a fixed LTI system 144 is provided at the output of the interleaved analog receiver 150. In this embodiment, the fixed LTI system 144 is realized with a combination of delay lines 204 and reconstruction filters 206, followed by a partially-populated addition matrix 208 that produces L combinations of z[n] outputs from the fixed LTI system 144. The L outputs from partially-populated addition matrix 208 are provided to a bank of memoryless nonlinearities 142-1 to 142-M. Each memoryless nonlinearities 142-1 to 144-M comprises N memoryless nonlinear (NL) compensators 126-1 to 126-N, which can be, for example, a sum of sinusoids with different coefficients (or different polynomials). Each signal provided at an output of a respective memoryless nonlinearity 142-1 to 142-M is summed by summer 209 to provide the output signal u[n]. As with other embodiments that have been disclosed herein, this embodiment of digital compensator 200 can provide a sum from summer 128 of the products of filtered and time-delayed analog receiver samples combined and mapped through memoryless nonlinearities to represent the harmonic and intermodulation distortion terms output by an M-way interleaved analog receiver 150. It is appreciated that this embodiment of a digital compensator 200 for an interleaved receiver can be used for efficient compensation of harmonics and intermodulation distortion terms of any order. It is also appreciated that the implementation of specialized LTI structure 144 and the shape of the memoryless nonlinearity 146 will depend heavily on the type of the interleaved analog receiver under consideration.

As has been discussed herein, according to aspects of various embodiments of digital compensators 200 of this disclosure, the digital compensators disclosed herein can reduce the corresponding memory effects. Reduction of memory effects is desirable because the complexity and power consumption of the digital compensator grows rapidly with increased memory effects. In a digital compensator, ignoring memory effects and attempting a direct map to a Volterra representation causes a prohibitively large number of terms (long memory and relatively large order) and also very sensitive and often poor fitting result (i.e. Volterra coefficient dependency on the properties of the system—μ). According to various embodiments of the digital compensator 200 disclosed herein, by offloading known memory effects to the special fixed linear time invariant (LTI) filter 160, the complexity of the nonlinear compensator 162 can be drastically reduced. This arrangement also significantly improves the stability of the compensator coefficients with respect to system properties μ, such as operating sampling rate, temperature, supply voltage, Nyquist range ($1^{st}$ or $2^{nd}$), type of input network, process variation indicators, etc.

Figure 17:
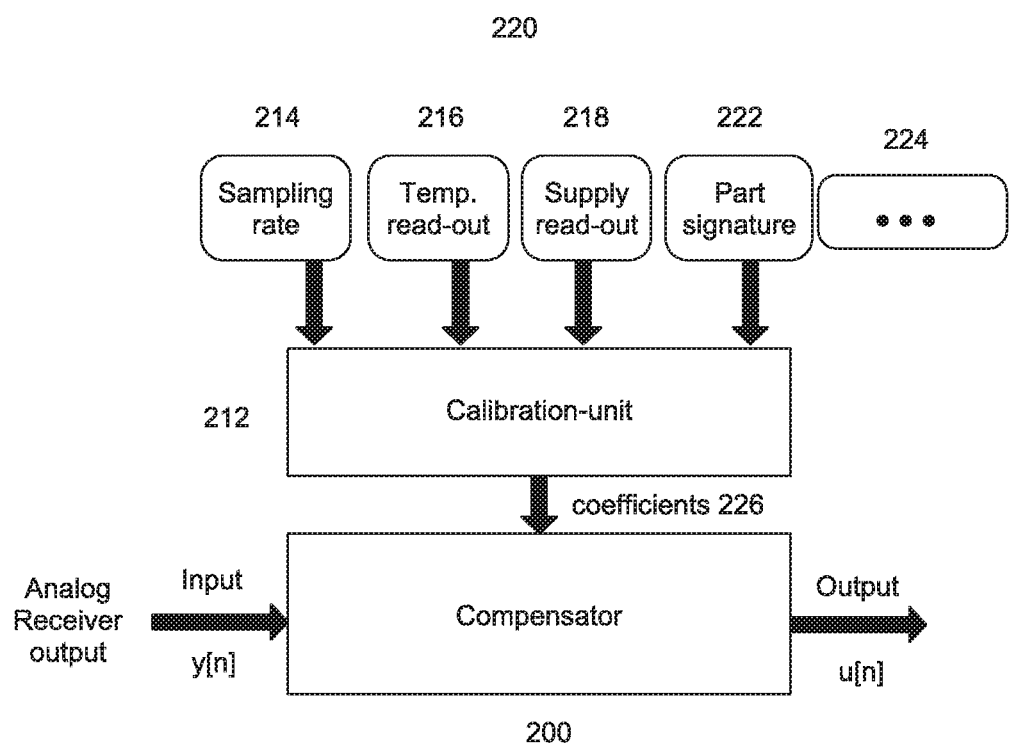
FIG. 17 illustrates one embodiment of a digital compensator 200 for achieving digital compensation that is consistent over different external parameters.

It is also important to ensure the digital compensation is consistent over different external parameters. FIG. 17 illustrates one embodiment of a digital compensator 200 for achieving such compensation. The overall compensator structure 220 has a main compensator unit 200, which can be any of the digital compensators that have been disclosed herein. The coefficients of the nonlinear maps in the main compensator 200 are affected by the external parameters μ such as sampling rate 214, temperature read-out 216, supply voltage read-out 218, and signature of a particular part 222. Other external parameters 224 can include any of Nyquist range ($1^{st}$ or $2^{nd}$), input termination impedance type, input from aging sensors, process variation, and the like. According to aspects of this embodiment, the coefficients of the main compensator 200 are re-computed by the calibration unit 212, depending on the value of the external parameters μ. In particular, based on the input values of the external parameters μ, the calibration unit determines the regime of operation for the main compensator 200 and outputs updated coefficients for the compensator. It is appreciated that these coefficients as a function of the regime of operation for the main compensator 200 can be determined in numerous ways such as the process disclosed above. In addition, the DUT 150 signature can be found during the initial calibration, which takes place during factory testing with a few excitation frequency tones 128 that have been discussed herein.

As has been discussed herein, according to aspects of various embodiments of a method of determining and various digital compensators disclosed herein, the digital compensators disclosed herein can be: designed and provided in combination with Analog Receivers to having a generalized topology; designed and provided in combination with Analog Receivers to a harmonic-specific topology; designed and provided in combination with Analog Receivers to tailor the compensation to a subset of the generalized topology to target only specific harmonics or ranges of harmonics, for example to possibly reduce the complexity/area/power of the combined Analog Receiver and Digital Compensator; designed and provided in combination with Analog Receivers to a specific Nyquist-range (e.g. 1st Nyquist region or 2nd Nyquist region) or to a Nyquist-specific topology; designed and provided in combination with Analog Receivers to provide particular Nyquist Programmable coefficients for the memoryless nonlinearities also adjusted for the Nyquist region to compensate for different ADC properties exhibited in a different Nyquist region; designed and provided in combination with interleaved Analog Receivers; and provided in combination with Analog Receivers to ensure the digital compensation is consistent over different external parameters. It is appreciated that these are only some of the applications of the methodology and the various embodiments of digital compensators disclosed herein.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A digital compensator comprising:
    at least one fixed, discrete-time (DT), linear time invariant (LTI) filter that provides an output signal z[n] and that is configured based on the known non-linear aspects of an analog receiver to a continuous time input signal x(t);
    a discrete-time, nonlinear compensator that follows the fixed, discrete-time (DT), linear time invariant (LTI) filter to receive the output signal z[n] and provides a compensated output signal u[n];
    wherein the digital compensator is configured to substantially reduce the one or more nonlinear distortion components in a sampled digital output signal of the analog receiver y[n] to provide the output signal u[n] achieving a receiver linearity requirement for the combination of the analog receiver and the digital compensator.

2. The digital compensator as claimed in claim 1, wherein the nonlinear compensator is configured to provide a sum of products of filtered and time-delayed analog receiver samples combined and mapped through memoryless nonlinearities to represent the sampled harmonic and intermodulation terms output by the analog receiver.

3. The digital compensator as claimed in claim 1, wherein the digital compensator is configured to replicate an added distortion component from the analog receiver and subtract the replicated distortion component so as to substantially reduce the added distortion component to yield a resulting distortion component of the output signal u[n] approximately proportional to the square of the added distortion component.

4. The digital compensator as claimed in claim 1, wherein the digital compensator includes a plurality of fixed, discrete-time (DT), linear time invariant (LTI) filters in series with a respective plurality of discrete-time, nonlinear compensators, with each such cascaded LTI filters and nonlinear compensator disposed in parallel and configured to account for varying harmonics.

5. The digital compensator as claimed in claim 1, wherein the fixed, discrete-time (DT), linear time invariant (LTI) filter comprises IIR filters that directly target certain harmonic resonances.

6. The digital compensator as claimed in claim 1, which comprises fixed, discrete-time (DT) linear time invariant (LTI) filters that are different for different Nyquist ranges.

7. The digital compensator as claimed in claim 1, wherein the nonlinear compensator comprises a memoryless (NL) compensator that compensates the signal z[n] from the at least one fixed, discrete-time (DT), linear time invariant (LTI) filter based on coefficients of compensation to provide the compensated output signal u[n].

8. The digital compensator as claimed in claim 7, wherein the memoryless nonlinear (NL) compensator comprises fixed coefficients that are different for different Nyquist ranges.

9. The digital compensator as claimed in claim 8, wherein the coefficients comprise coefficients of nonlinear maps that change with changes in external parameters $\mu$, and wherein the digital compensator further comprises a calibration unit that computes and provides the coefficients of the nonlinear maps to the memoryless (NL) compensator as a function of the value of the external parameters $\mu$.

10. The digital compensator as claimed in claim 9, wherein the calibration unit computes and provides the coefficients of the nonlinear maps to the memoryless (NL) compensator based at least one of known operating characteristics of the analog receiver, a sensed operating voltage, a sensed temperature, and a Nyquist sampling rate, Nyquist range ($1^{st}$ or $2^{nd}$), input termination impedance type, input from aging sensors, and process variation.

11. A non-linear digital compensation system, comprising:
    an analog receiver having a plurality of analog circuit components and an analog-to-digital converter, at least some of the analog circuit components having known nonlinear response characteristics to a continuous time input signal x(t), the analog receiver configured to receive the continuous time input signal x(t) and provide a sampled digital output signal y[n], which has one or more nonlinear distortion components; and
    a digital compensator coupled to an output of the analog receiver, the digital compensator comprising at least one fixed, discrete-time (DT), linear time invariant (LTI) filter that provides an output signal z[n] and that is configured based on the known non-linear aspects of the analog receiver to a continuous time input signal x(t), followed by at least one discrete-time, nonlinear compensator that provides a compensated output signal u[n], the digital compensator configured in combination with the analog receiver to substantially reduce the one or more nonlinear distortion components in the sampled digital output signal of the analog receiver y[n] to provide an output signal u[n] achieving a receiver linearity requirement for the combination of the analog receiver and a digital compensator.

12. The non-linear digital compensation system as claimed in claim 11, wherein the one or more nonlinear distortion components comprise sampled harmonic and intermodulation terms, and wherein the nonlinear compensator is configured to provide a sum of products of the filtered and time-delayed analog receiver samples combined and mapped through memoryless nonlinearities to represent the sampled harmonic and intermodulation terms output by the analog receiver.

13. The non-linear digital compensation system as claimed in claim 11, wherein the digital compensator is configured to replicate a discrete time distortion component from the analog receiver and subtract the replicated distortion component so as to substantially reduce the added distortion component provided by the analog receiver to yield a distortion component of the output signal u[n] approximately proportional to the square of the added distortion component.

14. The non-linear digital compensation system as claimed in claim 11, wherein the digital compensator includes a plurality of fixed, discrete-time (DT), linear time invariant (LTI) filters in series with a respective plurality of discrete-time, nonlinear compensators, with each such cascaded LTI filters and nonlinear compensator disposed in parallel and configured to account for varying harmonics.

15. The non-linear digital compensation system as claimed in claim 11, wherein the fixed, discrete-time (DT), linear time invariant (LTI) filter comprises IIR filters that directly target certain harmonic resonances.

16. The non-linear digital compensation system as claimed in claim 11, which comprises fixed, discrete-time (DT) linear time invariant (LTI) filters that are different for different Nyquist ranges.

17. The non-linear digital compensation system as claimed in claim 11, wherein the nonlinear compensator comprises a memoryless (NL) compensator that compensates the signal z[n] from the at least one fixed, discrete-time (DT), linear time invariant (LTI) filter based on coefficients of compensation to provide the compensated output signal u[n].

18. The non-linear digital compensation system as claimed in claim 17, wherein the memoryless nonlinear (NL) compensator comprises fixed coefficients that are different for different Nyquist ranges.

19. The non-linear digital compensation system as claimed in claim 17, wherein the coefficients for compensation comprise coefficients of nonlinear maps that change with changes in external parameters $\mu$, and wherein the digital compensator further comprises a calibration unit that computes and provides the coefficients of the nonlinear maps to the memoryless (NL) compensator as a function of the value of the external parameters $\mu$.

20. The non-linear digital compensation system as claimed in claim 19, wherein the calibration unit computes and provides the coefficients of the nonlinear maps to the memoryless (NL) compensator based at least one of known operating characteristics of the analog receiver, a sensed operating voltage, a sensed temperature, and a Nyquist sampling rate, Nyquist range ($1^{st}$ or $2^{nd}$), input termination impedance type, input from aging sensors, and process variation.

21. The non-linear digital compensation system as claimed in claim 11, wherein the analog receiver comprises M-way interleaved Analog-to-Digital Converters (ADCs), and wherein the digital compensator is configured to receive M output signals y[n] provided at the output of the interleaved analog receiver partially compensate the M output signals y[n] for known nonlinear response characteristics to a continuous time input signal x(t) to provide M output signals z[n] to M banks of programmable memoryless nonlinearities, which further compensate the M output signals z[n] based on coefficients of compensation to provide M output signals, and a summer that sums the M output signals to provide a compensated output signal u[n].

22. The non-linear digital compensation system as claimed in claim 21, wherein the a bank of programmable memoryless nonlinearities further comprises a respective first multiplier that multiplies one of M output signals from a bank with a sin function and a second multiplier that multiplies the one of M output signals with a cos function to provide a shift of each of M output signals.

23. The non-linear digital compensation system as claimed in claim 21, wherein the fixed LTI system comprises a combination of delay lines and reconstruction filters, followed by a partially-populated addition matrix that produces L combinations of z[n] outputs from the fixed LTI system.

24. The non-linear digital compensation system as claimed in claim 23, wherein each of the M banks of programmable memoryless nonlinearities comprises N memoryless nonlinear (NL) compensators with different compensation coefficients.

25. A method for designing a non-linear compensator system, comprising:
characterizing nonlinearities in an analog receiver design, the analog receiver configured to receive a continuous time input signal x(t) and provide a sampled digital output signal y[n];
designing a digital compensator for the analog receiver design based on the nonlinearities, the digital compensator configured to substantially reduce the nonlinearities in a sampled digital output signal y[n] of the analog receiver to provide an output signal u[n], the digital compensator comprising at least one fixed, discrete-time (DT), linear time invariant (LTI) filter configured based on the non-linearities of the analog receiver to a continuous time input signal x(t) that provides an output signal z[n] followed by at least one discrete-time, nonlinear compensator that provides a compensated output signal u[n].

26. The method for designing a non-linear system as claimed in claim 25, wherein the analog receiver comprises M-way interleaved Analog-to-Digital Converters (ADCs), and wherein designing the digital compensator comprises configuring the fixed, discrete-time (DT), linear time invariant (LTI) filter as a shared, fixed LTI system that receives M output signals y[n] provided at the output of the M-way interleaved Analog-to-Digital Converters (ADCs), that partially compensates the M output signals y[n] for known nonlinear response characteristics to provide M output signals z[n], and configuring the discrete-time, filter as M banks of programmable memoryless nonlinearities that further compensate the M output signals z[n] based on coefficients of compensation to provide M output signals, and further providing a summer that sums the M output signals to provide a compensated output signal u[n].

27. The method for designing a non-linear system as claimed in claim 25, wherein designing the digital compensator further comprises designing the nonlinear compensator to compensate for one or more sampled harmonic and intermodulation terms with a sum of filtered and time-delayed analog receiver samples combined and mapped through memoryless nonlinearities to represent sampled harmonic and intermodulation terms output by the analog receiver.

28. The method for designing a non-linear system as claimed in claim 25, wherein the method further comprises modeling the analog receiver as an ideal sampler that provides an undistorted discrete-time representation of the continuous time input signal x(t) and an added distortion (Δ) component.

29. The method for designing a non-linear system as claimed in claim 28, wherein the method further comprises implementing the digital compensator to be configured to replicate the added distortion component and to subtract the replicated distortion component so as to substantially reduce the added distortion component provided by the analog receiver to yield a distortion component of the output signal approximately proportional to the square of the added distortion component.

30. The method for designing a non-linear system as claimed in claim 25, wherein the method further comprises implementing the digital compensator as a plurality of fixed, discrete-time (DT), linear time invariant (LTI) filters in series with a respective plurality of discrete-time, nonlinear compensators, with each such cascaded LTI filters and nonlinear compensator disposed in parallel and configured to account for varying harmonics.

31. The method for designing a non-linear system as claimed in claim 25, wherein the method further comprises implementing the fixed, discrete-time (DT), linear time invariant (LTI) filter with IIR filters that directly target certain harmonic resonances.

32. The method for designing a non-linear system as claimed in claim 25, wherein the method further comprises implementing fixed, discrete-time (DT) linear time invariant (LTI) filters that are different for different Nyquist ranges.

33. The method for designing a non-linear system as claimed in claim 25, wherein the method further comprises implementing the nonlinear compensator as a memoryless (NL) compensator that compensates the signal z[n] from the at least one fixed, discrete-time (DT), linear time invariant (LTI) filter based on coefficients of compensation to provide the compensated output signal u[n].

34. The method for designing a non-linear system as claimed in claim 33, wherein the method further comprises implementing the memoryless (NL) compensator with non-linear maps that change with changes in external parameters μ, and designing the digital compensator further comprises providing a calibration unit that computes and provides the coefficients of the nonlinear maps to the memoryless (NL) compensator as a function of the value of the external parameters μ.

35. The method for designing a non-linear system as claimed in claim 34, wherein the method further comprises determining the coefficients based on at least one of known operating characteristics of the analog receiver, a sensed operating voltage, a sensed temperature, and a Nyquist sampling rate, Nyquist range ($1^{st}$ or $2^{nd}$), input termination impedance type, input from aging sensors, and process variation.

* * * * *